United States Patent
Banik, II et al.

(10) Patent No.: US 12,424,453 B2
(45) Date of Patent: Sep. 23, 2025

(54) LOW TEMPERATURE DIRECT COPPER-COPPER BONDING

(71) Applicant: Lam Research Corporation, Fremont, CA (US)

(72) Inventors: Stephen J. Banik, II, Philadelphia, PA (US); Justin Oberst, Beaverton, OR (US); Kari Thorkelsson, Portland, OR (US); Bryan L. Buckalew, Tualatin, OR (US); Thomas Anand Ponnuswamy, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 769 days.

(21) Appl. No.: 17/309,567

(22) PCT Filed: Dec. 7, 2019

(86) PCT No.: PCT/US2019/065111
§ 371 (c)(1),
(2) Date: Jun. 4, 2021

(87) PCT Pub. No.: WO2020/123322
PCT Pub. Date: Jun. 18, 2020

(65) Prior Publication Data
US 2022/0018036 A1 Jan. 20, 2022

Related U.S. Application Data

(60) Provisional application No. 62/777,649, filed on Dec. 10, 2018.

(51) Int. Cl.
*H01L 21/48* (2006.01)
*C25D 3/38* (2006.01)
(Continued)

(52) U.S. Cl.
CPC ............ *H01L 21/4846* (2013.01); *C25D 3/38* (2013.01); *C25D 5/022* (2013.01); *C25D 5/08* (2013.01);
(Continued)

(58) Field of Classification Search
CPC ......... H01L 21/3063–30635; H01L 21/32125; H01L 21/465; H01L 2224/80894–80896;
(Continued)

(56) References Cited

U.S. PATENT DOCUMENTS

| 5,431,803 A | 7/1995 | DiFranco et al. |
| 6,126,798 A | 10/2000 | Reid et al. |

(Continued)

FOREIGN PATENT DOCUMENTS

| CN | 1498987 A | 5/2004 |
| CN | 101016616 A | 8/2007 |

(Continued)

OTHER PUBLICATIONS

International Search Report and Written Opinion dated Feb. 14, 2020 issued in Application No. PCT/US2019/058354.
(Continued)

Primary Examiner — Julio J Maldonado
Assistant Examiner — Stanetta D Isaac
(74) Attorney, Agent, or Firm — Weaver Austin Villeneuve & Sampson LLP

(57) ABSTRACT

Direct copper-copper bonding at low temperatures is achieved by electroplating copper features on a substrate followed by electroplanarizing the copper features. The copper features are electroplated on the substrate under conditions so that nanotwinned copper structures are formed. Electroplanarizing the copper features is performed by anodically biasing the substrate and contacting the copper features with an electrolyte so that copper is electrochemi-
(Continued)

cally removed. Such electrochemical removal is performed in a manner so that roughness is reduced in the copper features and substantial coplanarity is achieved among the copper features. Copper features having nanotwinned copper structures, reduced roughness, and better coplanarity enable direct copper-copper bonding at low temperatures.

25 Claims, 16 Drawing Sheets

(51) Int. Cl.
    *C25D 5/00*     (2006.01)
    *C25D 5/02*     (2006.01)
    *C25D 5/08*     (2006.01)
    *C25D 5/18*     (2006.01)
    *C25D 5/48*     (2006.01)
    *C25D 7/12*     (2006.01)
    *C25D 17/00*     (2006.01)
    *C25D 21/12*     (2006.01)
    *C25F 3/02*     (2006.01)
    *C25F 3/22*     (2006.01)
    *H01L 23/00*     (2006.01)

(52) U.S. Cl.
CPC ............... *C25D 5/18* (2013.01); *C25D 5/48* (2013.01); *C25D 5/605* (2020.08); *C25D 5/617* (2020.08); *C25D 7/123* (2013.01); *C25D 17/001* (2013.01); *C25D 21/12* (2013.01); *C25F 3/02* (2013.01); *C25F 3/22* (2013.01); *H01L 24/11* (2013.01); *H01L 24/13* (2013.01); *H01L 24/742* (2013.01); *H01L 24/81* (2013.01); *H01L 2224/11462* (2013.01); *H01L 2224/11831* (2013.01); *H01L 2224/11901* (2013.01); *H01L 2224/13078* (2013.01); *H01L 2224/1308* (2013.01); *H01L 2224/13147* (2013.01); *H01L 2224/81895* (2013.01)

(58) Field of Classification Search
CPC .............. H01L 2224/81894–81896; H01L 2224/82895–82897; H01L 23/15; H01L 23/49866; H01L 23/49811; H01L 23/481; H01L 23/49838; H01L 23/50; H01L 2224/81895; H01L 2224/80009; H01L 2224/8002; C25F 3/02–14; C25F 3/22; C25F 3/12; C25F 7/00; C25F 3/16; C25F 3/14; C25D 5/48; C25D 5/605; C25D 5/617

See application file for complete search history.

(56) References Cited

U.S. PATENT DOCUMENTS

| | | | |
|---|---|---|---|
| 6,156,167 | A | 12/2000 | Patton et al. |
| 6,569,299 | B1 | 5/2003 | Reid et al. |
| 6,800,187 | B1 | 10/2004 | Reid et al. |
| 7,736,448 | B2 | 6/2010 | Lu et al. |
| 7,799,684 | B1 | 9/2010 | Reid et al. |
| 8,470,191 | B2 | 6/2013 | Mayer et al. |
| 8,901,744 | B2 | 12/2014 | Yang et al. |
| 10,094,033 | B2 | 10/2018 | Chen et al. |
| 10,141,392 | B2 | 11/2018 | Yang |
| 10,692,735 | B2 | 6/2020 | Thorkelsson et al. |
| 2002/0074238 | A1 | 6/2002 | Mayer et al. |
| 2006/0021878 | A1 | 2/2006 | Lu et al. |
| 2007/0017818 | A1* | 1/2007 | Emesh .............. H01L 21/32125 205/640 |
| 2013/0122326 | A1 | 5/2013 | Chen et al. |
| 2013/0270328 | A1 | 10/2013 | Cioccio et al. |
| 2014/0021633 | A1 | 1/2014 | Lee et al. |
| 2014/0103501 | A1 | 4/2014 | Chen et al. |
| 2014/0299478 | A1 | 10/2014 | Mayer et al. |
| 2016/0024678 | A1 | 1/2016 | Chen et al. |
| 2016/0355940 | A1* | 12/2016 | Chen ..................... C25D 21/10 |
| 2017/0358545 | A1 | 12/2017 | Choi et al. |
| 2018/0068834 | A1 | 3/2018 | Valcore, Jr. et al. |
| 2018/0231587 | A1 | 8/2018 | Ye et al. |
| 2018/0240783 | A1* | 8/2018 | Yang ................. H01L 23/53219 |
| 2018/0350765 | A1 | 12/2018 | Chang et al. |
| 2018/0366378 | A1 | 12/2018 | Kim et al. |
| 2022/0010446 | A1 | 1/2022 | Banik, II et al. |
| 2023/0212773 | A1 | 7/2023 | Oberst et al. |

FOREIGN PATENT DOCUMENTS

| | | | |
|---|---|---|---|
| CN | 102400188 | A | 4/2012 |
| CN | 105097746 | A | 11/2015 |
| CN | 106298634 | A | 1/2017 |
| EP | 1567691 | A1 | 8/2005 |
| JP | 2007262486 | A | 10/2007 |
| JP | 4476812 | B2 | 6/2010 |
| JP | 2014022743 | A | 2/2014 |
| JP | 2019133785 | A | 8/2019 |
| KR | 20120097344 | A | 9/2012 |
| KR | 20160108174 | A | 9/2016 |
| KR | 20170028259 | A | 3/2017 |
| KR | 20170141316 | A | 12/2017 |
| KR | 20190047404 | A | 5/2019 |
| TW | 200729476 | A | 8/2007 |
| TW | 201101512 | A | 1/2011 |
| TW | 201122163 | A | 7/2011 |
| TW | 201321557 | A | 6/2013 |
| TW | 201810579 | A | 3/2018 |
| WO | WO 2011-018478 | A1 | 2/2011 |
| WO | WO-2020092244 | A1 | 5/2020 |

OTHER PUBLICATIONS

International Search Report and Written Opinion dated Apr. 7, 2021 issued in Application No. PCT/US2019/065111.
Chen et al. "Low-Temperature and Low-Pressure Direct Copper-to-Copper Bonding by Highly (111)-Oriented Nanotwinned Cu", In: IEEE, Pan Pacific Microelectronics Symposium (Pan Pacific); Jan. 28, 2016, 5 pages.
U.S. Appl. No. 17/309,128, filed Apr. 27, 2021, Banik II., et al.
CN Office Action dated Nov. 14, 2023 in CN Application No. 201980087479.8, with English Translation.
CN Office Action dated Nov. 29, 2023 in CN Application No. 201980091560.3 with English translation.
Frank, A. et al., "The Decomposition of the Sulfonate Additive Sulfopropyl Sulfonate in Acid Copper Electroplating Chemistries", Journal of The Electrochemical Society, 2003, vol. 150, No. 4, pp. C244-C250.
Hasegawa, M. et al., "Orientation-Controlled Nanotwinned Copper Prepared by Electrodeposition", Electrochimica Acta, Oct. 1, 2015, vol. 178, pp. 458-467.
International Preliminary Report on Patentability dated Dec. 1, 2022, in PCT Application No. PCT/US2021/032072.
International Search Report and Written Opinion dated Sep. 2, 2021 in Application No. PCT/US2021/032072.
International Preliminary Report on Patentability dated Jun. 24, 2021 issued in Application No. PCT/US2019/065111.
International Preliminary Report on Patentability dated May 14, 2021 issued in Application No. PCT/US2019/058354.
International Search Report and Written Opinion dated Jul. 15, 2021 issued in Application No. PCT/US2021/023942.
Lam Research., "Nanotwin Copper Plating Review", Dec. 19, 2019, Lam Research Corp, pp. 1-20.
Liu, C. et al., "Effect of Grain Orientations of Cu Seed Layers on the Growth of 111-Oriented Nano twinned Cu," Scientific Reports, Aug. 19, 2014, vol. 4, No. 1, pp. 1-4.
Liu, T. et al., "Fabrication and Characterization of (111)-Oriented and Nanotwinned Cu by DC Electrodeposition," Crystal Growth & Design, Oct. 3, 2012, vol. 12, No. 10, pp. 5012-5016.

(56) References Cited

OTHER PUBLICATIONS

Office Action Requirement for Restriction/Election dated Feb. 3, 2022 issued in U.S. Appl. No. 17/309,128.
TW Office Action dated Feb. 17, 2024 in TW Application No. 108144896 with English Translation.
TW Office Action dated Jul. 5, 2023, in application No. TW108139187 with English translation.
TW Office Action dated Nov. 10, 2023 in TW application No. TW108144896 with English Translation.
U.S. Advisory Action dated Oct. 4, 2022, in U.S. Appl. No. 17/309,128.
U.S. Final office Action dated Aug. 1, 2022 in U.S. Appl. No. 17/309,128.
U.S. Non-Final office Action dated Apr. 14, 2022 in U.S. Appl. No. 17/309,128.
U.S. Non-Final Office Action dated Mar. 3, 2023 in U.S. Appl. No. 17/309,128.
U.S. Appl. No. 17/998,886, inventors Oberst et al., filed Nov. 15, 2022.
CN Office Action dated Jul. 1, 2024 in CN Application No. 201980087479.8 with English translation.
CN Office Action dated Sep. 4, 2024 in CN Application No. 201980087479.8 with English translation.
KR Notice of Allowance dated Aug. 20, 2024 in KR Application No. 10-2021-7021042, with English Translation.
KR Office Action dated Apr. 22, 2024 in KR Application No. 10-2021-7021042, with English Translation.
TW Office Action dated May 22, 2024 in TW Application No. 108144896, with English translation.
JP Office Action dated Apr. 30, 2025 in JP Application No. 2022570253, with English Translation.
KR Office Action dated Dec. 18, 2024 in KR Application No. 10-2021-7016192, with English Translation.
TW Office Action and Search Report dated Jan. 24, 2025 in TW Application No. 110117679, with English Translation.
U.S. Restriction Requirement dated Feb. 28, 2025 in U.S. Appl. No. 17/998,886.

* cited by examiner

LOW TEMPERATURE DIRECT COPPER-COPPER BONDING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD

Implementations herein relate to methods and apparatuses for electroplating and electroplanarizing copper features for direct copper-copper bonding and, more particularly, to electroplating and electroplanarizing copper features for direct copper-copper bonding at low temperatures in 3-D integrated circuits.

BACKGROUND

Integrated circuit (IC) chips or dies are typically interfaced with other circuits using a package that can be connected to, e.g., a printed circuit board (PCB). The IC chip may have contact pads that connect to components of the IC chip by way of vertically extending vias and horizontally extending wires or traces. IC packaging involves interconnecting IC chips to external circuitry. In some cases, IC packaging includes wafer level packaging (WLP), which is an electrical connection technology that employs relatively large features, typically on the scale of micrometers. WLP strategies may involve wire bonding, in which the IC chip is mounted upright and wires are used to interconnect contact pads to external circuitry. WLP strategies may involve flip-chip bonding, where the IC chip is "flipped over" so that it faces down and its contact pads align with matching pads on an external circuit. Examples of WLP structures include redistribution wiring, bumps, and pillars.

The packaging standard may be specified industry-wide or specific to a particular company or group of companies. For example, an IC die package can be packaged as an industry standard ball grid array (BGA) package used in flip-chip bonding. A BGA package has an array of solder ball pads positioned on a bottom surface of a substrate, where solder balls contact the pads/ports of a PCB and the solder balls are reflowed to attach to the package of a PCB. In such an implementation of a BGA package, bonds are connected between pads/ports of the die and electrical features of the substrate.

Shrinking feature sizes are pushing advances in IC chip packaging. Developments in micro-bump technologies and copper pillar technology have led to increasing input/output (I/O) density, smaller area I/O pitch, and smaller standoff height in IC chip packages. Direct copper-copper bonding presents an approach that enables reduction in interconnection length and greater packaging density to provide increased device performance.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is method of preparing copper features for direct copper-copper bonding. The method includes forming a plurality of first copper features on a first substrate, each of the plurality of first copper features having nanotwinned copper structures, and electroplanarizing the plurality of first copper features by electrochemically removing a portion of exposed copper from the first copper features prior to directly bonding the first substrate to a second substrate having a plurality of second copper features disposed on the second substrate.

In some implementations, the method further includes forming the plurality of second copper features on the second substrate, the plurality of second features having nanotwinned copper structures, and electroplanarizing the plurality of second copper features by electrochemically removing a portion of exposed copper from the second copper features. In some implementations, electroplanarizing the plurality of first copper features includes anodically biasing the first substrate and contacting the plurality of first copper features with an electrolyte. In some implementations, anodically biasing the first substrate and contacting the plurality of first copper features with the electrolyte includes electroetching the copper of the plurality of first copper features below a critical potential, and electropolishing the copper of the plurality of first copper features above a critical potential. In some implementations, the electrolyte includes copper ions and an acid, where a viscosity of the electrolyte is at least about 4 centipoise. In some implementations, the electrochemical removal of the portion of the exposed copper from the first copper features improves both within die uniformity and within feature uniformity. In some implementations, the method further includes directly bonding the plurality of first copper features with the plurality of second copper features on the second substrate to connect the first substrate and the second substrate. In some implementations, the plurality of first copper features and the plurality of second copper features are directly bonded at a temperature less than about 250° C. In some implementations, forming the plurality of first copper features on the first substrate includes contacting a surface of the substrate with an electroplating solution, and applying a first current to the first substrate when the first substrate is contacted with the electroplating solution to deposit the plurality of first copper features having nanotwinned copper structures, where the first current includes a pulsed current waveform that alternates between a constant current and no current.

Another aspect involves an apparatus. The apparatus includes an electroplating cell for holding an electroplating solution, an electrochemical metal removal cell for holding an electrolyte; and a power supply for applying current to one or more substrates during electroplating and during electrochemical metal removal. The apparatus further includes a controller configured with instructions for performing the following operations: form a plurality of first copper features on a first substrate in the electroplating cell, each of the plurality of first copper features having nanotwinned copper structures, and electroplanarize the plurality of first copper features by electrochemically removing a portion of exposed copper from the first copper features in the electrochemical metal removal cell.

In some implementations, the controller is further configured with instructions for performing the following operations: directly bond the plurality of first copper features with a plurality of second copper features on a second substrate to connect the first substrate and the second substrate. In some implementations, the plurality of first copper features and the plurality of second copper features are directly bonded at a temperature less than about 250° C. In some implementations, the controller is further configured with instructions for performing the following operation: transfer the first substrate to a system configured to directly bond the first substrate with a second substrate having a plurality of second copper features disposed on the second substrate. In some implementations, the controller configured with instructions to form the plurality of first copper feature includes instructions to cathodically bias the first substrate to a first current comprising a pulsed current waveform and contact the first substrate with an electroplating solution, and where the controller configured with instructions to electroplanarize the plurality of first copper features includes instructions to anodically bias the first substrate and contact the first substrate with an electrolyte.

These and other aspects are described further below with reference to the drawings.

DETAILED DESCRIPTION

Figure 1A:
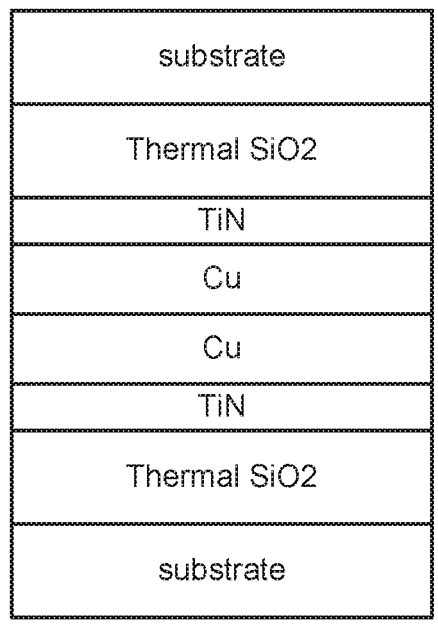
FIG. 1A shows a schematic diagram of an example copper-copper bonding structure.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

INTRODUCTION

Advancements in materials, processing, and equipment have led to innovations in packaging technologies. Wafer level packaging, bumping, redistribution layers, fan out, and through-silicon vias are some of the techniques employed in advanced packaging. In many cases, integrated circuit packaging involves wafer level packaging (WLP), which is an electrical connection technology that employs relatively large features, typically on the scale of micrometers. Examples of WLP features include redistribution wiring, bumps, and pillars. Such features in WLP applications and advanced packaging applications may include copper. Copper is generally used in metal connecting devices because of its high electrical conductivity, thermal transferring ability, and low cost.

In a typical electroplating process, a substrate is cathodically biased and is brought in contact with an electroplating solution containing ions of a metal that is being plated. Ions of the metal are electrochemically reduced at the surface of the substrate to form a metal layer. The metal layer may be a copper layer. Electroplated copper of the present disclosure may be used in wafer level packaging applications and advanced packaging applications.

Direct copper-copper bonding may be used in 3-D integrated circuit design to reduce interconnection length and increase packing density. Direct copper-copper bonding may replace conventional wire bonding techniques and controlled collapse chip connection (C4) techniques. Such techniques may occupy greater amounts of available space in an IC package. Direct copper-copper bonding may also replace the use of solders such as solder bumps and solder caps. However, the use of solders generally results in large volumes occupied by intermetallic compounds that can lead to microstructural defects and reliability concerns. Direct copper-copper bonding may provide electrical interconnections that occupy less space and without intermetallic compounds. Direct copper-copper bonding precludes solder connections and enables finer-pitch die layouts. In some instances, direct copper-copper bonding provides ultra-short interconnects with high electrical conductivity.

Typically, direct copper-copper bonding occurs by thermo-compression, where the bonding process employs reasonably high temperatures and pressure application. Some direct copper-copper bonding techniques employ ultra-high vacuum conditions but require plasma for surface activation. Thus, many direct copper-copper bonding techniques require at least a high thermal budget or ultra-high vacuum with surface preparation.

Direct copper-copper bonds may be achieved by stacking two active device wafers back-to-back. Copper elements or features may be deposited on each of the device wafers, where the copper features can include but are not limited to copper plates, copper layers, copper pads, copper pillars, copper connection lines, and the like. Copper features on one of the device wafers may be aligned with copper features opposite on another one of the device wafers. Top surfaces of the copper features may be flushed against each other. In some implementations, to improve the direct bonding at an interface between copper features, surfaces of the copper features may be treated to reduce their roughness. For example, copper features may be polished by a chemical mechanical polishing (CMP) operation.

FIG. 1A shows a schematic diagram of an example copper-copper bonding structure. A substrate may include a semiconductor substrate such as a silicon substrate. A dielectric layer such as a silicon dioxide ($SiO_2$) layer is deposited over the substrate. A copper layer is deposited over the dielectric layer. In some embodiments, a diffusion barrier layer such as a titanium nitride (TiN) layer may be deposited between the copper layer and the dielectric layer, where the diffusion barrier layer serves to prevent copper diffusion into the dielectric layer and the silicon substrate. In some embodiments, the copper layer may be annealed to stabilize the copper layer microstructure. In some embodiments, the copper layer is polished by CMP. Another substrate with an identical or similar stack may be placed symmetrically over the copper layer. Copper layers are directly bonded to form the copper-copper bonding structure.

Figure 1B:
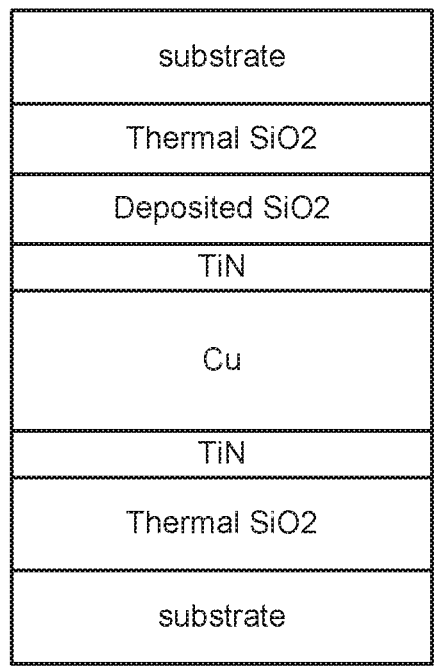
FIG. 1B shows a schematic diagram of an example encapsulated copper structure.

FIG. 1B shows a schematic diagram of an example encapsulated copper structure. Rather than directly bonding copper layer to copper layer, dissymmetric stacks are formed. A dielectric layer such as a $SiO_2$ layer is formed over a substrate. A first diffusion barrier layer is formed over the dielectric layer, a copper layer is formed over the first diffusion barrier layer, a second diffusion barrier layer is formed over the copper layer, and a deposited $SiO_2$ layer is formed over the second diffusion barrier layer. Thus, a SiO2—TiN—Cu—TiN—SiO2 multilayer stack may be deposited on the substrate without an air break. Opposite the multilayer stack, another substrate is provided having a $SiO_2$ layer formed thereon. The $SiO_2$ layers on each of the substrates are directly bonded together. Direct bonding of $SiO_2$ layers may not have the same requirements as direct bonding of copper layers.

Current methods in direct copper-copper bonding in FIG. 1A may result in severe voiding. For example, at the bonding interface between copper layers, lenticular voids and other voids may form. Additionally, direct copper-copper bonding generally requires polishing by CMP before the copper layers are suitable for bonding. In FIG. 1B, direct $SiO_2$—$SiO_2$ bonding may mitigate voiding in an encapsulated copper structure. However, various other voids may arise in other layers and interfaces as a result of high bonding temperature requirements for direct $SiO_2$—$SiO_2$ bonding. Furthermore, direct $SiO_2$—$SiO_2$ bonding may not be universally applicable in various IC fabrication contexts.

Direct Copper-Copper Bonding Using Nanotwinned Copper and Electroplanarization

The present disclosure provides a copper interconnect formed by direct bonding at a low temperature and without CMP treatment. Copper features are electroplated over a substrate under conditions that form nanotwinned copper structures. Bonding between copper features having nanotwinned copper structures may enable direct bonding at low temperatures, moderate pressures, and lower bonding forces/times. Copper features are polished and planarized by an electroplanarization process that electrochemically removes copper. The electroplanarization process provides highly coplanar and smooth bonding surfaces for direct copper-copper bonding. Thus, direct copper-copper bonds may be formed with low temperatures, moderate pressures, short bonding times, and few voids.

In a face-centered cubic (FCC) crystal structure, of which copper is included, coherent twin boundaries may be formed as (111) mirror planes from which the normal stacking sequence of (111) planes is reversed. In other words, adjacent grains are mirrored across coherent twin boundaries in a layered (111)-structure. Twins grow in a layer-by-layer manner extending along a lateral (111) crystal plane where a twin thickness is on the order of nanometers, hence the name "nanotwins." Nanotwinned copper (nt-Cu) exhibits excellent mechanical and electrical properties and may be used in a wide variety of applications in wafer level packaging and advanced packaging designs.

Compared to copper having conventional grain boundaries, nanotwinned copper possesses strong mechanical properties including high strength and high tensile ductility. Nanotwinned copper also demonstrates high electrical conductivity, which may be attributable to the twin boundary causing electron scattering that is less significant compared to a grain boundary. Furthermore, nanotwinned copper exhibits high thermal stability, which may be attributable to the twin boundary having excess energy on the order of magnitude lower than that of a grain boundary. In addition, nanotwinned copper enable high copper atom diffusivity, which is useful for copper-to-copper direct bonding. Nanotwinned copper also shows high resistance to electromigration, which may be a result of twin boundaries slowing down electromigration-induced atomic diffusion. Nanotwinned copper demonstrates a strong resistance to seed etch that may be important in fine-line redistribution layer applications. Nanotwinned copper also shows low impurity incorporation, which results in fewer Kirkendall voids as a result of soldered reactions with the nanotwinned copper.

Figure 2:
FIG. 2 shows a cross-section scanning electron microscopy (SEM) image of a copper pillar with randomly-oriented grain structures.

FIG. 2 shows a cross-section SEM image of a copper pillar with randomly-oriented grain structures. The copper pillar includes several submicron-sized grains, where the grains are randomly oriented. Typically, copper is electrodeposited under conditions that result in randomly-oriented grain structures as shown in FIG. 2.

Figure 3:
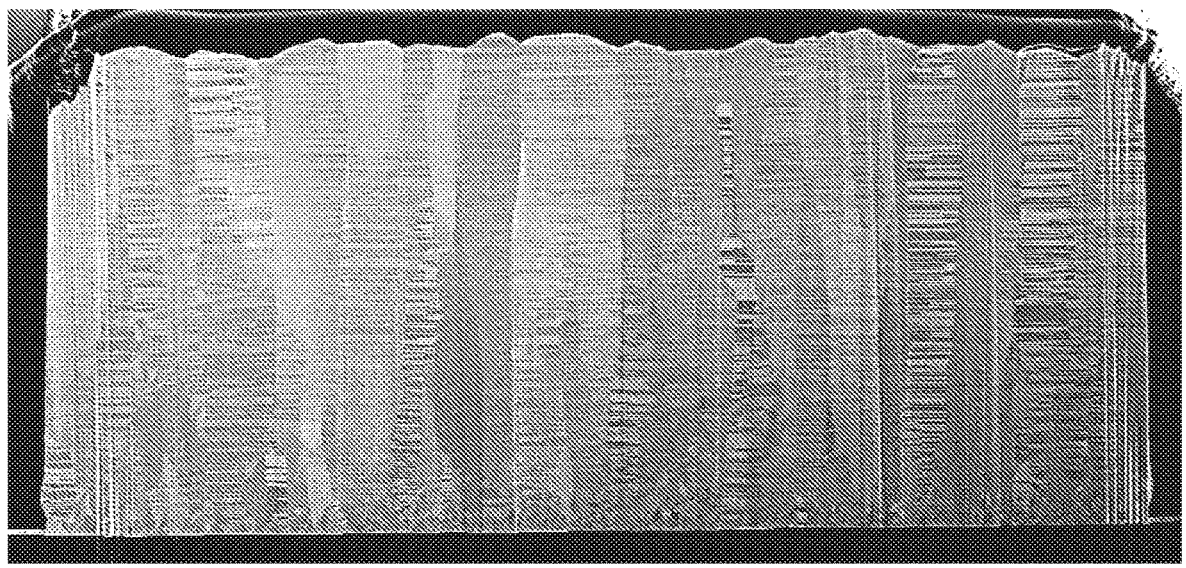
FIG. 3 shows a cross-section SEM image of a copper pillar with nanotwinned grain structures.

FIG. 3 shows a cross-section SEM image of a copper pillar with nanotwinned grain structures. The presence of nanotwinned grain structures can be observed using any suitable microscopy technique such as an electron microscopy technique. The copper pillar includes several submicron-sized grains that are tall and columnar. For example, the grains may have a diameter between about 1 nm and about 1000 nm. As shown in FIG. 3, the grains are highly columnar and have a high density of grown-in nanotwins. The highly columnar grains may have a relatively large diameter and relatively large height. For example, an average diameter of the highly columnar grains may be between about 0.2 μm and about 20 μm, and an average height of the highly columnar grains may be between about 1 μm and about 200 μm. A high density of nanotwins is observed by a high density of twin lamellar structures parallel to each other or at least substantially parallel to each other. A pair of adjacent dark and light lines may constitute a nanotwin, and nanotwins may stack along a stacking direction (e.g., along a [111] crystal axis) to form a grain. The nanotwins may be formed parallel to the (111) surface of the copper pillar. An average lamella thickness varies from about a few nanometers to about hundreds of nanometers. For example, an average lamella thickness can be between about 5 nm and about 100 nm. An average length of the lamellar structures may vary from tens of nanometers to tens of microns hundreds of nanometers. For example, an average lamella length can be as small as 50 nm and as large as 20 μm, or the entire width of a columnar grain. Copper with nanotwinned grain structures as shown in FIG. 3 may be electrodeposited under conditions as described in the present disclosure.

Nanotwinned copper structures may be characterized by a plurality of (111)-oriented crystal copper grains containing a plurality of nanotwins. In some implementations, the plurality of (111)-oriented crystal copper grains contain a high density of nanotwins. As used herein, a "high density of nanotwins" may refer to copper structures having at least several tens or hundreds of nanotwins parallel or at least substantially parallel to each other as observed using suitable microscopy techniques.

The crystal orientation of the crystal copper grains may be characterized using a suitable technique such as electron backscatter diffraction (EBSD) analysis. In some implementations, crystal orientation maps may be displayed in inverse pole figure (IPF) maps. Nanotwinned copper structures may contain primarily (111)-oriented grains.

Figure 4:
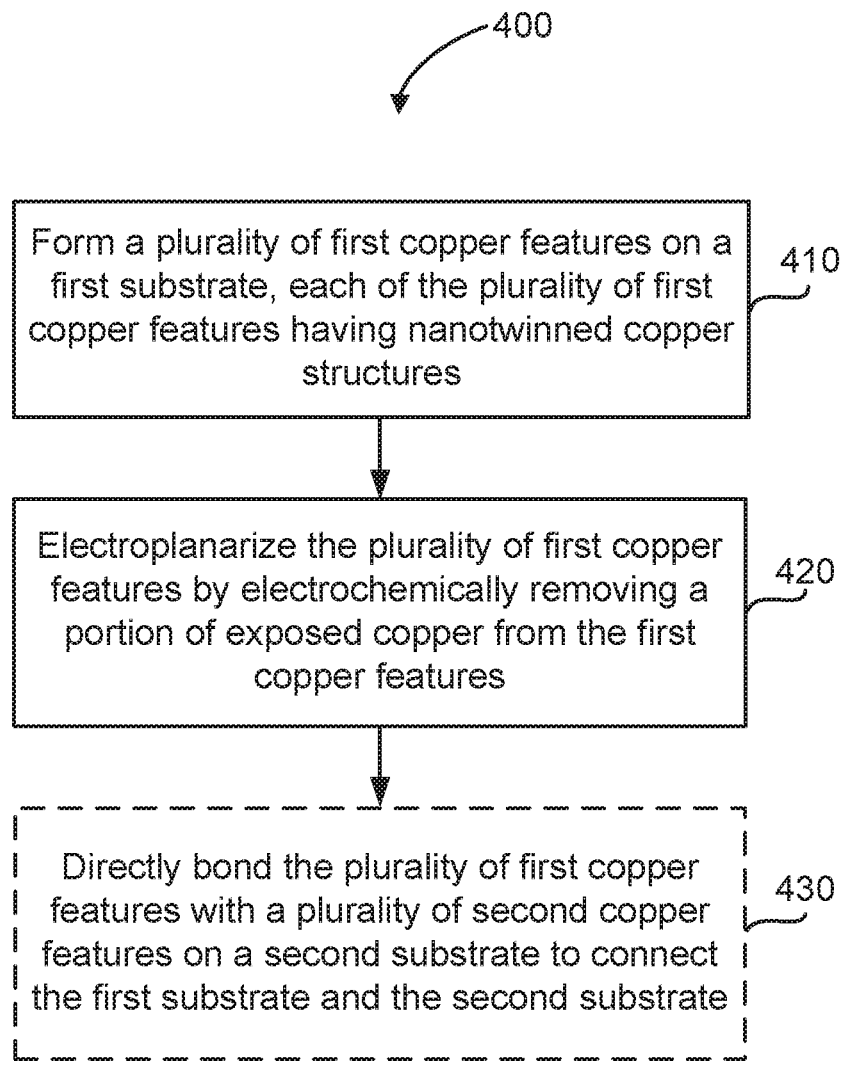
FIG. 4 shows a flow diagram of an example method of preparing copper features for direct copper-copper bonding according to some implementations.

FIG. 4 shows a flow diagram of an example method of preparing copper features for direct copper-copper bonding according to some implementations. The operations in a process 400 may be performed in different orders and/or with different, fewer, or additional operations. In some implementations, the operations in the process 400 may be performed in an apparatus configured for electroplating and electrochemical metal removal. Specifically, electroplating and electroplanarization operations may be performed in the same tool platform. In some implementations, the operations in the process 400 may be performed in separate apparatuses or systems, where electroplating operations may be performed in an electroplating apparatus and electroplanarization operations may be performed in an electrochemical metal removal apparatus. Examples of electroplating apparatuses and electrochemical metal removal apparatuses are described in FIGS. 11-14. One example of an electroplating apparatus is the Sabre® Electroplating System produced by and available from Lam Research Corporation of Fremont, CA.

At block 410 of the process 400, a plurality of first copper features are formed on a first substrate, each of the plurality of first copper features having nanotwinned copper structures. The plurality of first copper features may include copper wires, copper plates, copper layers, copper pads, copper connection lines such as redistribution lines (RDL), and copper pillars such as micro-pillars, standard pillars and integrated high density fallout (HDFO), and mega-pillars. The feature widths can vary widely, with the methods of the present disclosure being particularly useful for larger features, such as for features with widths from about 1 μm and about 300 μm, such as from 5 μm (RDL) to 200 μm (mega-pillars). For example, the methods of the present disclosure can be used during fabrication of a copper interconnect with a plurality of micro-pillars having widths of about 20 μm or a plurality of mega-pillars having widths of about 200 μm. The aspect ratios of the first copper features can vary, and in some embodiments have a height-to-width aspect ratio from about 1:2 to 2:1, and higher. In some implementations, the plurality of first copper features formed on the first substrate have different widths (diameters), aspect ratios, and pitches. In some implementations, the plurality of first copper features include a plurality of first dense features and one or more first isolated features.

When forming the plurality of first copper features on the first substrate, the plurality of first copper features may be formed on a layer of the first substrate. In some implementations, the layer of the first substrate upon which the plurality of first copper features are formed may include a dielectric layer such as $SiO_2$. In some implementations, the layer of the first substrate upon which the plurality of first copper features are formed may include a diffusion barrier layer or adhesion layer such as titanium (Ti), titanium tungsten (TiW), titanium nitride (TiN), tantalum (Ta), and tantalum nitride (TaN). In some implementations, the layer of the first substrate upon which the plurality of first copper features are formed may include a seed layer such as a copper seed layer. In forming the plurality of first copper features, the plurality of copper features may be deposited and patterned using recessed features formed in a mask. The recessed features may also be referred to as through mask recessed features. For example, a photoresist mask may be deposited over the substrate and patterned using a photolithographic technique to define the through mask recessed features. Copper is electroplated into the through mask recessed features.

The plurality of first copper features are formed by electroplating. Plating conditions can be controlled to reproducibly electroplate first copper features with a high density of nanotwinned copper structures at an acceptable plating rate. Some of the plating conditions include but are not limited to electroplating solution chemistry, crystal structure and orientation of an underlying base layer, and waveform of applied current to the substrate during electroplating. Other plating conditions for depositing nanotwinned copper structures may further include flow conditions of the electroplating solution when contacting the substrate, temperature, and chemical pretreatment such as dipping in suppressor, or cleaning with acetone, acid, piranha solution, or some other cleaning agent.

In electroplating the plurality of first copper features, a surface of a substrate is contacted with an electroplating solution while the substrate is cathodically biased. The substrate and the electroplating solution may be contained or held in a plating chamber. In some implementations, the substrate is immersed in the electroplating solution and is held by a substrate holder or holding fixture. In some implementations, the composition of the electroplating solution may include a copper salt, an acid, and optionally organic additives. Example copper salts include, but are not limited to, copper sulfate, copper methanesulfonate, copper pyrophosphate, copper propanesulfonate, etc. Example acids include, but are not limited to, sulfuric acid and methane sulfonic acid. In some implementations, the electroplating solution contains halide ions that may act as bridges to assist adsorption of certain organic additives onto a substrate surface. Example halide ions include but are not limited to chloride ions, bromide ions, iodide ions, and combinations thereof. In some implementations, the electroplating solution contains complexing agents that can bind with copper ions and form soluble complexes. Example complexing agents include but are not limited to ethylenediaminetetraacetic acid (EDTA), nitrilotriacetic acid (NTA), citric acid, and glutamic acid. Organic additives may be important in achieving a desired metallurgy, film uniformity, defect control, and fill performance. Example organic additives typically include suppressors and accelerators and possibly levelers.

In some implementations, the electroplating solution is free or substantially free of accelerators when depositing the plurality of first copper features. As used herein, "substantially free of" may refer to a concentration of accelerators that is equal to or less than about 5 ppm. In some implementations, the a concentration of accelerators is between about 0 ppm and about 5 ppm, and a concentration of suppressors is between about 30 ppm and about 300 ppm. In some alternative implementations, the electroplating solution may contain accelerators when an underlying base layer upon which the nanotwinned copper structure is deposited is highly oriented. In such instances, the concentration of accelerators may be equal to or greater than about 5 ppm, or between about 5 ppm and about 40 ppm.

The electroplating solution may be flowed into the plating cell to contact the surface of the first substrate. The electroplating apparatus may be configured to enable flow of the electroplating solution in a direction towards or perpendicular to the surface of the substrate. In some implementations, the electroplating solution may be flowed from holes of a channeled ionically resistive element during electroplating. A flow rate or flow velocity of the electroplating solution may be controlled to promote formation of nanotwins in the plurality of first copper features. Lower flow rates making contact with the first substrate during electroplating may promote a higher density of nanotwins than higher flow rates. In some implementations, the flow velocity of the electroplating solution is equal to or less than about 70 cm/s, or equal to or less than about 30 cm/s. In other words, the flow velocity can be between about 30 cm/s and about 70 cm/s. In some implementations, the flow rate of the electroplating solution is equal to or less than about 50 liters per minute, equal to or less than about 20 liters per minute, or between about 20 liters per minute and about 50 liters per minute.

In some implementations of the process 400, the first substrate may be chemically pretreated prior to contacting the first substrate with the electroplating solution. The chemical pretreatment may cause an increase in density of nanotwins when depositing the plurality of first copper features. In some implementations, the first substrate is chemically pretreated by immersing in a solution with suppressor additives. In some implementations, the first substrate is chemically pretreated by cleaning with acetone, acid, piranha solution, or some other suitable cleaning solution.

A first current is applied to the first substrate when the first substrate is contacted with the electroplating solution to electrodeposit the plurality of first copper features on the first substrate, where the first current comprises a pulsed current waveform that alternates between a constant current and no current. The first current is applied when cathodically biasing the first substrate while the electroplating solution is contacting the first substrate. During electroplating, current and/or voltage are supplied to the electroplating apparatus in a manner that causes copper to deposit on the first substrate, which acts as a cathode. The applied current may be modulated during electroplating.

The plurality of first copper features may be deposited on the first substrate by applying the first current that uses pulsed current deposition. The first current has a pulsed current waveform that alternates between a constant current ($I_{on}$) and no current ($I_{off}$). The first current provides a direct current (DC) having a current density that is between about 1 A/dm$^2$ and about 12 A/dm$^2$, between about 2 A/dm$^2$ and about 8 A/dm$^2$, or about 4 A/dm$^2$. The current density is controlled to promote formation of nanotwins. A minimum current density (e.g., 2 A/dm$^2$) may be necessary to promote formation of nanotwins at an acceptable plating rate, and a maximum current density (e.g., 8 A/dm$^2$) may inhibit formation of nanotwins.

A duration of no current ($T_{off}$) being applied is substantially greater than a duration of the constant current ($T_{on}$) being applied in the pulsed current waveform. In some implementations, the duration of no current is at least three times longer than a duration of the constant current. In some implementations, the duration of no current being applied can be between about 0.3 seconds and about 8 seconds; or between about 0.4 seconds and about 6 seconds, or between about 0.5 seconds and about 5 seconds. In some implementations, the duration of constant current being applied can be between about 0.05 seconds and about 2.5 seconds, between about 0.1 seconds and about 2 seconds, or between about 0.1 seconds and about 1.5 seconds. Examples of $T_{on}/T_{off}$ for the pulsed current waveform may be 0.1/0.5, 0.2/1, 0.5/2, 1/4, or 1.5/6 with a current density of about 4 A/dm$^2$. Durations for $T_{on}/T_{off}$ may be tuned to achieve a high density of nanotwins at an acceptable plating rate. An acceptable plating rate for sufficiently high throughput applications may be at least about 0.1 μm per minute, at least about 0.15 μm per minute, at least about 0.2 μm per minute, or at least about 0.5 μm per minute.

Cycles of alternating constant current and no current in the pulsed current waveform are repeated until a desired thickness is achieved. In some implementations, at least about 500 cycles are repeated, at least about 1000 cycles are repeated, at least about 2000 cycles are repeated, or at least about 3000 cycles are repeated. In some implementations, an average thickness of the plurality of first copper features is at least a few micrometers. For example, the average thickness of the first copper features deposited by the first current using the pulsed current waveform is at least about 1 μm, at least about 2 μm, and at least about 3 μm. In some implementations, the average thickness of the first copper features deposited by the first current using the pulsed current waveform is up to about 3 μm for an increased density of nanotwins.

Figure 5A:
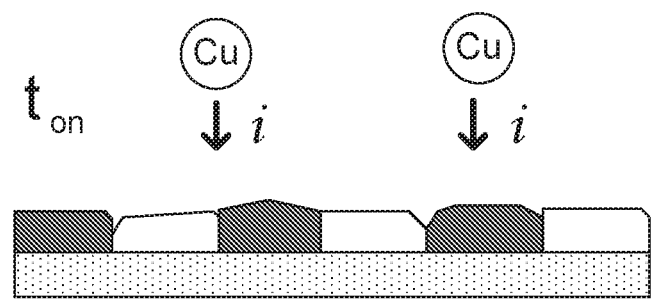
FIGS. 5A-5C show cross-sectional schematic illustrations of copper grain structures in a sequence for forming nanotwins during electroplating according to some implementations.
Figure 5B:
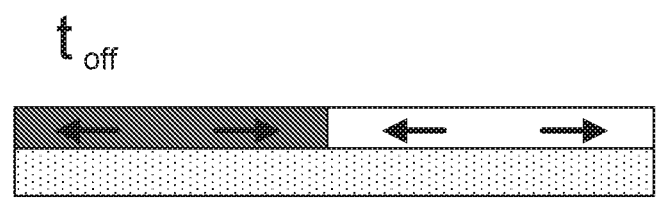
Figure 5C:
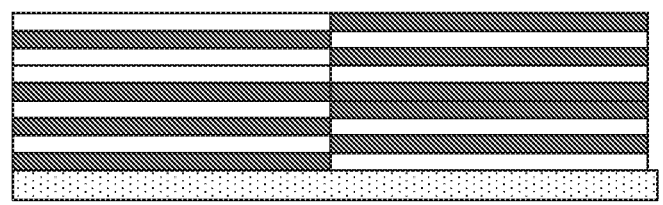

Without being limited by any theory, the pulsed current waveform facilitates growth of (111)-oriented nanotwinned crystal copper grains. FIGS. 5A-5C show cross-sectional schematic diagrams of copper grain structures in a sequence for forming nanotwins during electroplating according to some implementations. FIGS. 5A-5B illustrate a single plating cycle and FIG. 5C illustrates multiple plating cycles. In FIG. 5A, a constant current is applied for a duration of $T_{on}$ during electroplating where the applied constant current drives the reaction of copper ions in the electroplating solution to copper metal. During application of the constant current, copper is deposited so that copper grain structures are oriented in various crystallographic orientations. Examples of crystallographic orientations of the copper grain structures include (110), (100), and (111). In FIG. 5B, no current is applied following application of the constant current for a duration of $T_{off}$. When no current is applied, copper atoms may rearrange and relax internal stresses, thereby allowing the copper grain structures to relax to their lowest energy states. As a result, the copper grain structures generally relax to crystallographic orientations of (111), which is more energetically favorable. Twinning occurs at the nanoscale as the internal stresses of the crystal structure relax. The duration of $T_{off}$ is sufficiently long to permit nanotwinning. However, the duration of $T_{off}$ cannot be excessively long to lower the plating rate below an acceptable throughput. In addition, the duration of $T_{off}$ cannot be excessively long to expose the substrate to the electroplating solution for a prolonged period to cause degradation of various materials (e.g., polymer photoresist). In FIG. 5C, multiple cycles that alternate between constant current and no current are performed. Each of the cycles is performed using a pulsing sequence $T_{on}/T_{off}$. Nanotwins grow in (111)-oriented copper grains and stack in a layer-by-layer manner along a [111] crystal axis, thereby forming a nanotwinned copper structure of a desired thickness.

Returning to FIG. 4 of the process 400, a second current is optionally applied to the first substrate when the first substrate is contacted with the electroplating solution, where the second current comprises a constant current waveform. The first current may be applied to the substrate to deposit a first average thickness of at least about 1 µm of the plurality of first copper features before applying the second current to deposit a second average thickness of the plurality of first copper features. The constant current waveform provides a constant current having a current density between about 1 A/dm$^2$ and about 12 A/dm$^2$, between about 2 A/dm$^2$ and about 8 A/dm$^2$, or about 4 A/dm$^2$. A high density of nanotwins may surprisingly continue to form when transitioning from a pulsed current waveform to a constant current waveform. Thus, transitioning from a pulsed current waveform to a constant current waveform does not prevent formation of nanotwins. Typically, application of a constant current waveform does not result in nanotwinning in copper structures. However, application of a constant current waveform following application of a pulsed current waveform may produce nanotwinning in copper structures. Without being limited by any theory, the underlying layer that contains the plurality of (111)-oriented nanotwinned copper crystal grains provides a stacking pattern that continues to propagate even upon transitioning from a pulsed current waveform to a constant current waveform. Transitioning from a pulsed current waveform to a constant current waveform can occur after a first average thickness of the plurality of first copper features is formed using the pulsed current waveform. In some implementations, the first average thickness of the plurality of first copper features can be at least about 0.2 µm, at least about 0.5 µm, at least about 1 µm, at least about 3 µm, at least about 5 µm, between about 0.5 µm and about 10 µm, between about 1 µm and about 5 µm, or perhaps as little as about 0.1 µm. A remainder of the plurality of first copper features is formed using the constant current waveform after application of the pulsed current waveform.

In some implementations, an effective plating rate when depositing the nanotwinned copper structure using the first current (pulsed current waveform) and the second current (constant current waveform) is at least about 0.3 µm per minute, at least about 0.5 µm per minute, at least about 0.7 µm per minute, at least about 1 µm per minute, or between about 0.5 µm per minute and about 1 µm per minute.

In some implementations, control of substrate temperature can increase or decrease the density of nanotwins. Too high of a temperature can reduce the density of nanotwins, and too low of a temperature can reduce the density of nanotwins. In some implementations, a substrate temperature can be between about 10° C. and about 45° C., or between about 20° C. and about 35° C. Without being limited by any theory, a lower temperature can reduce spacing between nanotwins, thereby increasing density.

In some implementations, the plurality of first copper features may be formed by depositing on a highly-oriented base layer. Where the nanotwinned copper structure is deposited on a highly-oriented base layer, electroplating conditions for depositing the nanotwinned copper structure may be different than when depositing on other types of layers. In some implementations, the electroplating solution and/or the applied current waveform may be different when depositing on a highly-oriented base layer than when depositing on other types of layers. A highly-oriented base layer may share crystallographic properties similar to the nanotwinned copper structures. The crystallographic properties may include but are not limited to orientation and shape of grain structures in the underlying base layer. In some implementations, the base layer may be considered "highly-oriented" where it includes a plurality of columnar grain structures. In some implementations, the base layer may be considered "highly-oriented" where it includes a plurality of <111> crystal grain structures in a face-centered cubic structure. Without being limited by any theory, the orientation of the grain structures creates a stacking arrangement that promotes the growth of (111)-oriented nanotwins. In some implementations, the highly-oriented base layer is a diffusion barrier layer having a plurality of columnar grain structures. Examples of materials in a diffusion barrier layer include but are not limited to titanium (Ti), titanium tungsten (TiW), titanium nitride (TiN), tantalum (Ta), and tantalum nitride (TaN). In some implementations, the highly-oriented base layer is a copper seed layer having a plurality of <111> crystal grain structures. Typically, nanotwinned copper structures are deposited using an electroplating solution that is free or at least substantially free of an accelerator additive. In other words, the presence of an accelerator additive ordinarily inhibits the formation of nanotwins in copper features. However, when depositing on a highly-oriented base layer such as a diffusion barrier layer with columnar grain structures or a copper seed layer with <111> crystal grain structures, nanotwinned copper structures may be deposited using an electroplating solution that contains accelerators. The presence of accelerators in electroplating solutions may be useful in a variety of electroplating operations and tends to promotes bottom-up void-free filling of features.

In some implementations, the plurality of first copper features may be formed by depositing on a non-copper seed layer. The non-copper seed layer may also be referred to as a "non-copper seed," "non-copper liner," or "non-copper liner layer." The non-copper seed layer may include an electrically conductive material such as ruthenium (Ru), gold (Au), or cobalt (Co). The electrically conductive material may be more electrically resistive than copper. In some implementations, the non-copper seed layer includes cobalt. The plurality of first copper features may be deposited on a cobalt seed layer without depositing on a copper seed layer. This shows that the plurality of first copper features can be deposited on foreign metallic material that does not necessarily share the same crystallographic properties as copper. In some implementations, the plurality of first copper features may be deposited on the non-copper seed layer using a pulsed current waveform or a pulsed current waveform followed by a constant current waveform. In some implementations, the plurality of first copper features may be deposited on the non-copper seed layer using an electroplating solution free of or substantially free of an accelerator additive. First copper features may be deposited on seed layers, regardless of whether the seed layers are copper seed layers or cobalt seed layers, using electroplating conditions described earlier herein.

Electroplating of the plurality of first copper features may result in various plating non-uniformities across the plurality of first copper features. This includes within die non-uniformities such as variations in height/thickness across the plurality of first copper features, leading to a lack of coplanarity across the plurality of first copper features. This also includes within feature non-uniformities such as uneven portions across a width/diameter of each first copper feature, resulting in surface roughness in each first copper feature. Without being limited by any theory, it is believed that ionic current distribution during electroplating is not uniform so that the plating rates of copper may be different across the through mask recessed features. Differing plating rates lead to increased height/thickness variability. It is also believed that flow circulation of the electroplating solution is not uniform within the through mask recessed features. This leads to irregularities in surface topography.

Figure 6A:
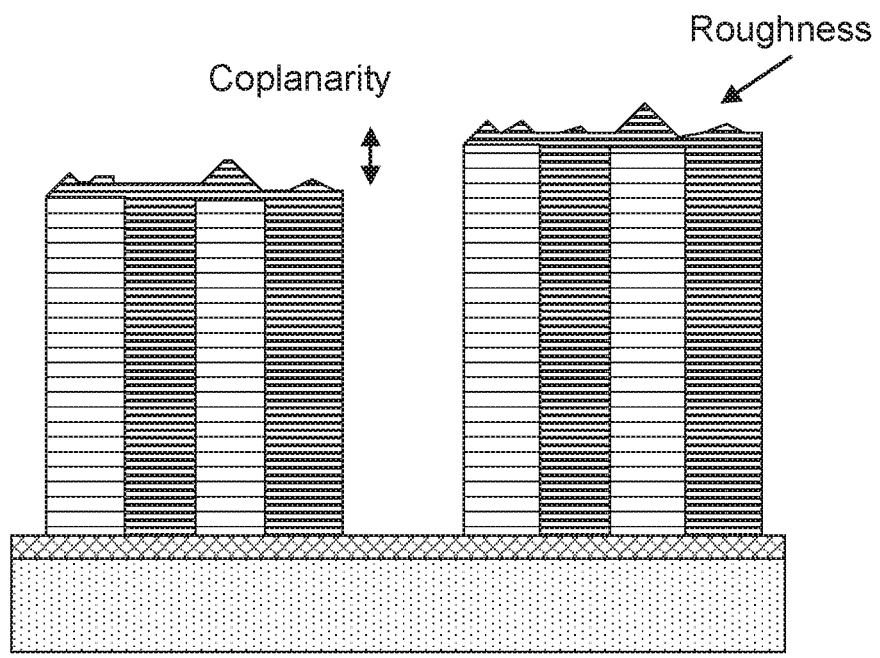
FIG. 6A shows a cross-sectional schematic illustration of a plurality of copper features on a substrate exhibiting coplanarity and roughness issues.

FIG. 6A shows a cross-sectional schematic illustration of a plurality of copper features on a substrate exhibiting coplanarity and roughness issues. The plurality of copper features are deposited on a substrate with a copper seed layer formed thereon. It will be appreciated that the substrate may include additional layers underlying the copper seed layer, such as a diffusion barrier layer, adhesion layer, dielectric layer, or combinations thereof. A photoresist mask (not shown) may be deposited over the copper seed layer, and the photoresist mask may be patterned with through mask recessed features. Copper may be electroplated in the through mask recessed features, where the conditions of electroplating promote formation of nanotwinned copper structures. The photoresist mask is subsequently removed. Plating non-uniformities may occur during electroplating of the plurality of copper features in the through mask recessed features. As shown in FIG. 6A, such plating non-uniformities may occur locally in each copper feature that result in surface roughness, and such plating non-uniformities may also occur globally across the plurality of copper features in a die that result in non-coplanar surfaces.

Coplanarity among copper features in a die may be measured by within die non-uniformity. On the substrate having the plurality of copper features, a range of feature heights (the difference between the tallest and shortest feature) is calculated for each die, and is divided by 2. The average of these half ranges for all die on the substrate provides a measure of within die non-uniformity. Roughness within a copper feature may be measured by within feature non-uniformity. On the substrate having the plurality of copper features, a range is calculated for each feature as a difference between the thickest part of the feature and the thinnest part of the feature. The average of these ranges is the within feature non-uniformity.

Variations in coplanarity and irregularities in surface topography present challenges in direct copper-copper bonding. Variations in coplanarity across the plurality of copper features lead to unwanted gaps when attaching with another substrate having a set of copper features formed thereon that mirror the plurality of copper features. Bonding does not take place where there are unwanted gaps. Irregularities in surface topography cause interfacial voids and defects to form when attaching with the substrate having the set of copper features that mirror the plurality of copper features.

The electroplanarization process of the present disclosure improves within die uniformity and within feature uniformity. The electroplanarization process electrochemically removes portions of exposed copper in the plurality of copper features to planarize copper features having different heights to address variations in coplanarity. The electroplanarization process also electrochemically removes portions of exposed copper in the plurality of copper features to planarize each copper feature having irregularities in surface topography. The electroplanarization process of the present disclosure improves within die uniformity by a significant amount, such as an improvement greater than 10%, an improvement between about 10% and about 50%, and an improvement up to 100% (e.g., all features are the same height). The electroplanarization process of the present disclosure also improves within feature uniformity by a significant amount, such as an improvement greater than 10%, an improvement between about 10% and about 50%, an improvement between about 15% and about 30%, and an improvement up to 100% (e.g., each feature being perfectly flat). For example, in some implementations, the surface roughness of each of the copper features may be equal to or less than about 10 nm RMS (root mean square), or may be equal to or less than about 6.5 nm RMS. However, it will be appreciated that rougher surfaces (e.g., greater than about 10 nm RMS) may be acceptable in some cases for direct bonding. A more detailed description of electroplanarization is found in U.S. patent application Ser. No. 16/040,407 filed Jul. 19, 2018 and entitled, "ELECTRO-OXIDATIVE METAL REMOVAL IN THROUGH MASK INTERCONNECT FABRICATION," which is incorporated by reference in its entirety and for all purposes.

Electroplanarization is used herein as a general term for an electrochemical metal removal process accompanied by an improvement in any type of uniformity such as reduction in metal thickness variation, including thickness variation on a substrate level, die level, and feature level. Electroplanarization may describe a process of electroetching and electropolishing. Electroplanarization may be used interchangeably with the terms "electrochemical etch-back," "electroetching," "electropolishing," "electrochemical metal removal," and "electrochemical metal dissolution."

Electroplanarization generally involves contacting a working surface of a substrate having an exposed copper layer with an electrolyte and anodically biasing the substrate so that copper is electrochemically dissolved in the electrolyte. Electrochemical dissolution occurs according to the reaction: $Cu^0 \rightarrow Cu^{2+} + 2e^-$. The substrate is anodically biased using electrical contacts that are connected to a conductive portion of the substrate and which are electrically connected to a power supply. For example, the electrical contacts are made to a copper seed layer underlying a mask layer. In some implementations, the working surface of the substrate is immersed in the electrolyte. In some implementations, when copper is electrochemically removed and dissolved in the electrolyte, copper metal may be deposited on a cathode. Unlike chemical mechanical polishing (CMP), electroplanarization of the present disclosure does not rely on the use of a mechanical pad, physical contact with solid polishing instruments, and/or abrasive slurries for uniformity improvement, but use one or more of electrolyte fluid dynamics, electrolyte composition, and specific electrochemical regimes to achieve improvement of uniformity during copper removal. Electroplanarization allows for improvements to uniformity while features remain recessed within a masking layer and avoids exertion of physical forces that would otherwise damage copper features.

Figure 6B:
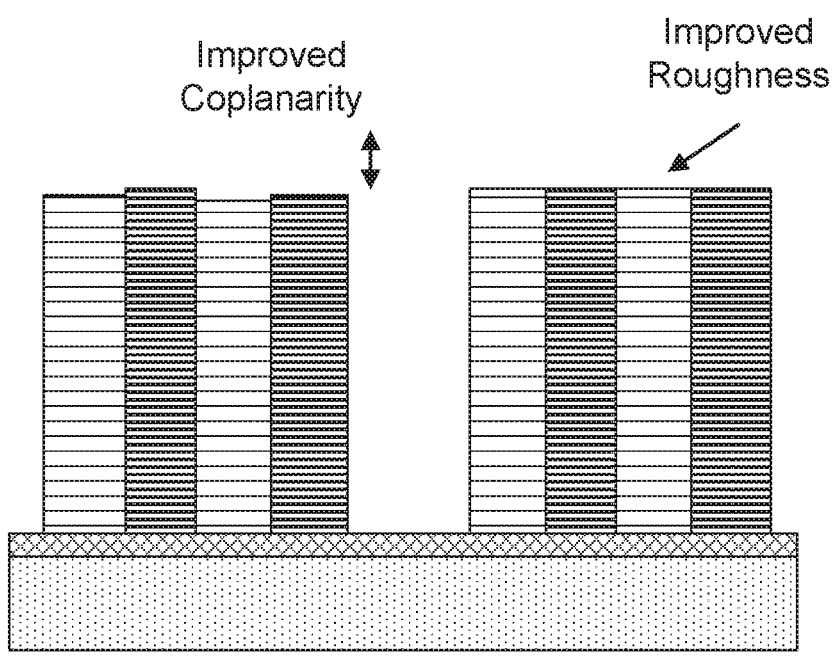
FIG. 6B shows a cross-sectional schematic illustration of a plurality of copper features on a substrate exhibiting improved coplanarity and roughness following an electroplanarization process according to some implementations.

FIG. 6B shows a cross-sectional schematic illustration of a plurality of copper features on a substrate exhibiting improved coplanarity and roughness following an electroplanarization process according to some implementations. After electroplating of the plurality of copper features on the substrate in the through mask recessed features, the substrate is immersed in an electrolyte and the substrate is anodically biased so that portions of copper in the through mask recessed features are electrochemically dissolved in the electrolyte. The substrate may be anodically biased to a substrate potential in an electroetching regime or electropolishing regime. In an electroetching regime, copper features that are less recessed (e.g., larger height) experience greater ionic current and will etch at faster rates than copper features that are more recessed (e.g., smaller height). Electroetching may improve within die uniformity. The plurality of copper features undergo electroetching when the substrate potential is below a critical potential. In an electropolishing regime, the copper removal rate in less recessed features (e.g., larger height) can be greater than more recessed features (e.g., smaller height). Furthermore, within a single feature, thicker (higher-lying) and more exposed portions of a feature experience greater rates of copper removal than relatively thinner (lower-lying) and less exposed portions. Electropolishing may improve both within die uniformity and within feature uniformity. The plurality of copper features undergo electropolishing when the substrate potential is above the critical potential. By controlling the substrate potential, the plurality of copper features may be electrochemically etched and polished to achieve improved coplanarity and surface roughness.

Figure 7A:
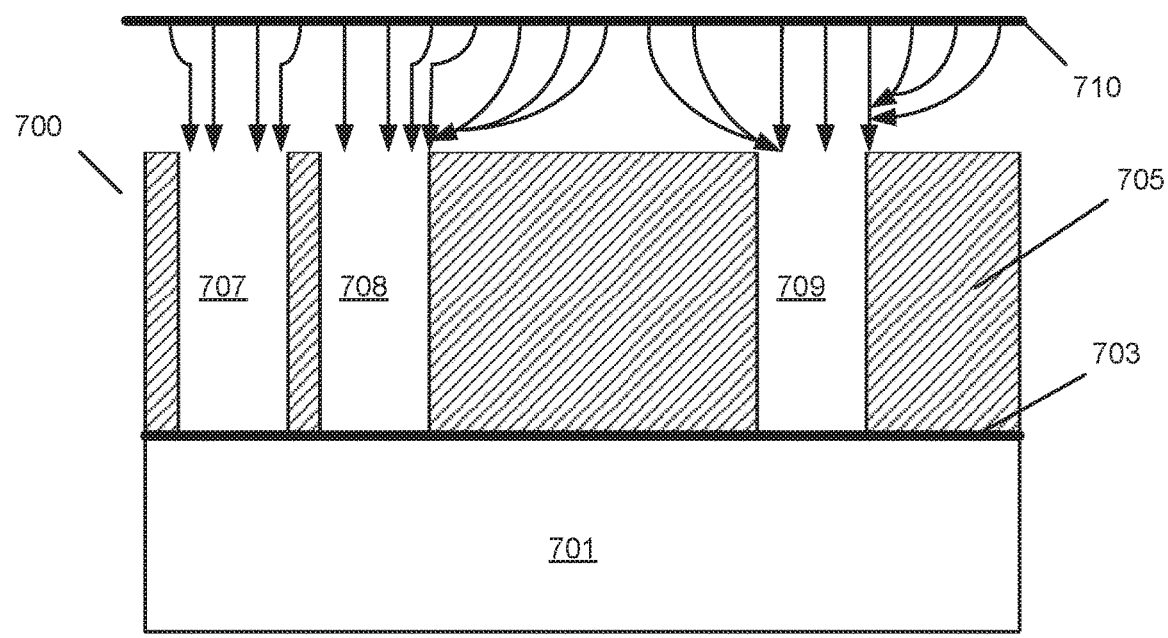
FIGS. 7A-7D show cross-sectional schematic diagrams of a substrate undergoing an electroplanarization process for improved within die uniformity according to some implementations.

FIGS. 7A-7D show cross-sectional schematic diagrams of a substrate undergoing an electroplanarization process for improved within die uniformity according to some implementations. In FIG. 7A, the process begins with providing a substrate having through mask recessed features. A substrate 700 includes a layer 701 such as a dielectric layer (e.g., SiO$_2$). It will be understood that the layer 701 may include other layers such as adhesion layers or diffusion barrier layers, and semiconducting material such as silicon. The substrate 700 further includes a copper seed layer 703 disposed on the layer 701. A patterned non-conductive mask layer 705 (e.g., photoresist) is disposed on the copper seed layer 703, and has a plurality of recessed features formed in the mask layer 705 such that the copper seed layer 703 is exposed at the bottom portions of the recessed features. FIG. 7A shows two recessed features 707 and 708 that are disposed proximate each other and an isolated recessed feature 709 at a greater distance from the closest recessed feature 708. The substrate 700 shown in FIG. 7A can be obtained by providing a semiconductor substrate having an exposed layer 701 (e.g., dielectric layer); depositing a copper seed layer 703 by any suitable method (e.g., physical vapor deposition); depositing a mask layer 705 over the copper seed layer 703 (e.g., spin-coating a photoresist mask); and patterning the mask layer 705 using, for example, a photolithographic technique to define the recessed features 707, 708, and 709. The dimensions of the recessed features 707, 708, and 709 will vary depending on the application, and typically have widths of between about 5 μm and about 250 μm, and aspect ratios of between about 1:2 and about 15:1.

Figure 7B:
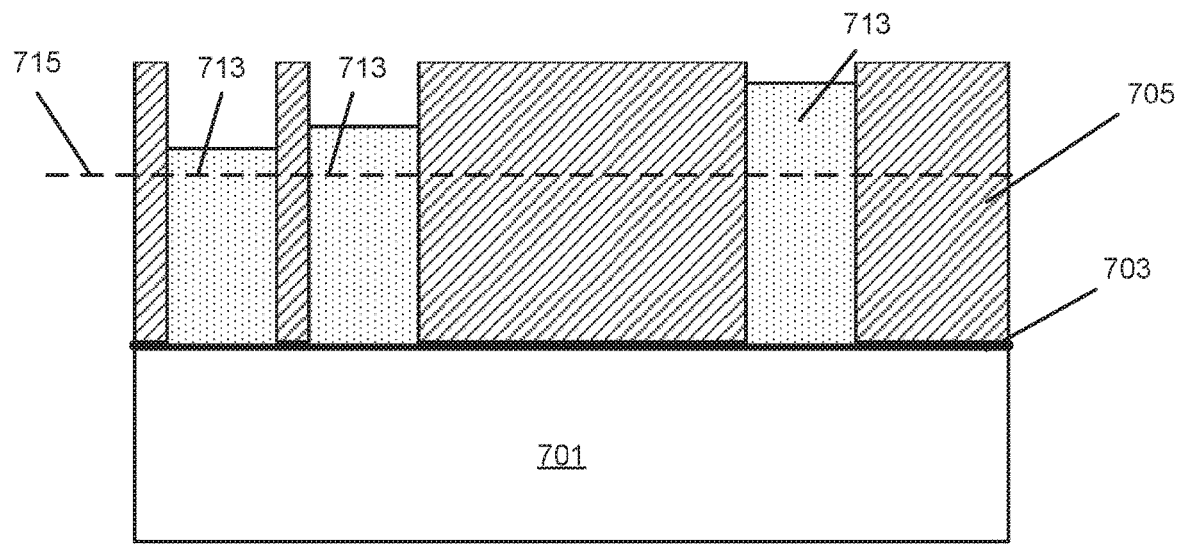

In FIG. 7B, copper is electroplated into the recessed features 707, 708, and 709 to fill the recessed features (partially, completely, or overfilled). Because the copper seed layer 703 connects all the features with a relatively small resistance to current flow relative to the resistivity of the electrolyte, and because the isolated recessed feature 709 presents a lower resistance to the passage of current in the electrolyte, the isolated recessed feature 709 tends to be the location of higher ionic current. The distribution of the ionic current field is schematically shown by arrows in FIG. 7A. The more isolated recessed feature 709 will experience greater ionic current flux than recessed features 707 and 708, resulting in a higher plating rate in the isolated recessed feature 709. This leads to within die non-uniformity. During electroplating, the substrate 700 is cathodically biased via the copper seed layer 703 that is exposed and is electrically connected to a power supply. The substrate 700 is placed into an electroplating cell opposite an anode 710, and a working surface of the substrate 700 is immersed in the electrolyte containing copper ions and an acid for increasing electrolyte conductivity. The copper 713 is electroplated in the recessed features 707, 708, and 709 to a level that is greater than a target level 715. In the depicted example, the fastest feature fill occurs in the isolated recessed feature 709 and the slowest feature fill occurs in recessed feature 707. The overplating beyond the target level 715 may be greater than about 10% of the target plated thickness, such as between about 10% and about 50% greater than that of the target plated thickness. The overplated copper 713 is removed (sacrificed) in a subsequent electrochemical removal step as uniformity is improved during removal. In some implementations, one or more of the recessed features 707, 708, and 709 are completely filled or even overfilled above the level of the mask layer 705. Thus, the substrate 700 may include recessed features 707, 708, and 709 that are partially filled, completely filled, or overfilled with copper 713.

Figure 7C:
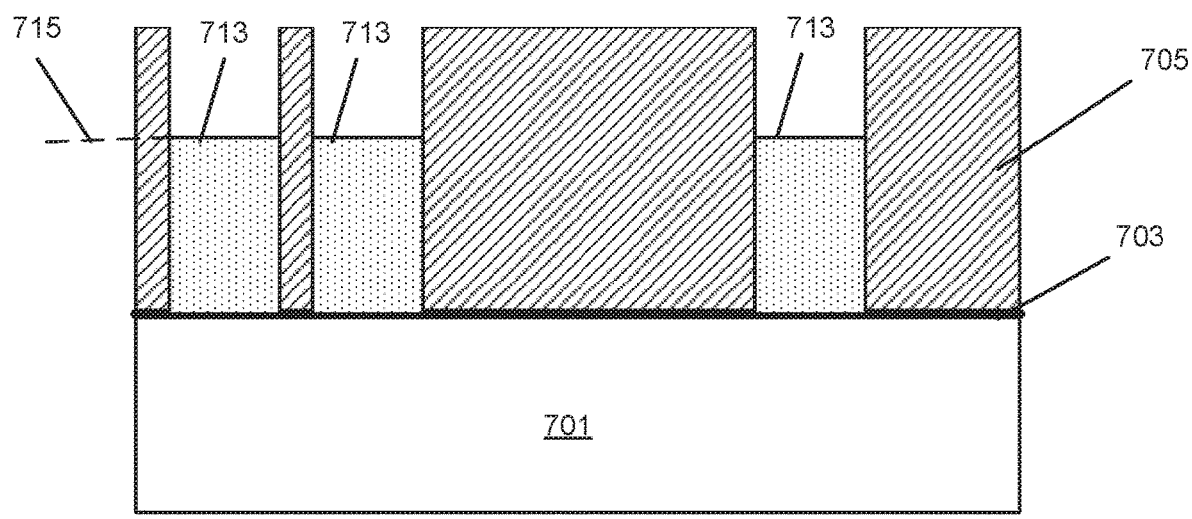

In FIG. 7C, copper 713 is electrochemically removed in each recessed feature 707, 708, and 709 and stopped at a point where the average of feature thicknesses approaches a target thickness at the target level 715. The electrochemical removal process improves uniformity by reducing thickness variation across the recessed features 707, 708, and 709. The electrochemical removal process is configured such that the removal-rate-ratio R2 between the fastest plated feature and the slowest plated feature is greater than the plating-rate-ratio R1 between the same pair. When R2 is greater than R1, the net result is improved thickness uniformity. The process conditions for electroplanarization can be configured for improved uniformity control, via utilization of distinct electrochemical regimes, as described in detail below.

Figure 7D:
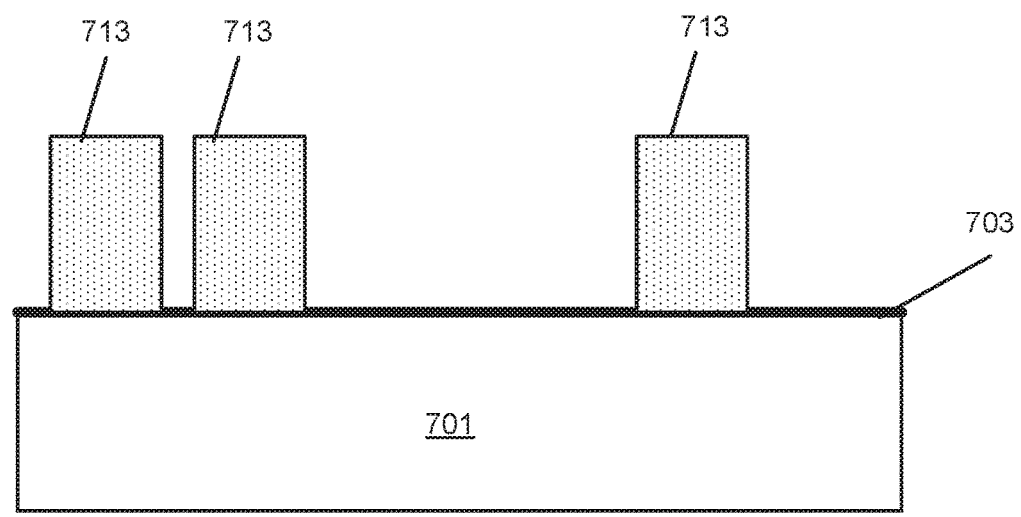

In FIG. 7D, after the electrochemical removal process is performed, the mask layer 705 is removed. For example, photoresist can be removed by photoresist stripping. The substrate 700 has a plurality of copper features 713 in the form of copper bumps and/or pillars. In some implementations, the copper seed layer 703 can be removed in a subsequent etching operation.

Figure 8A:
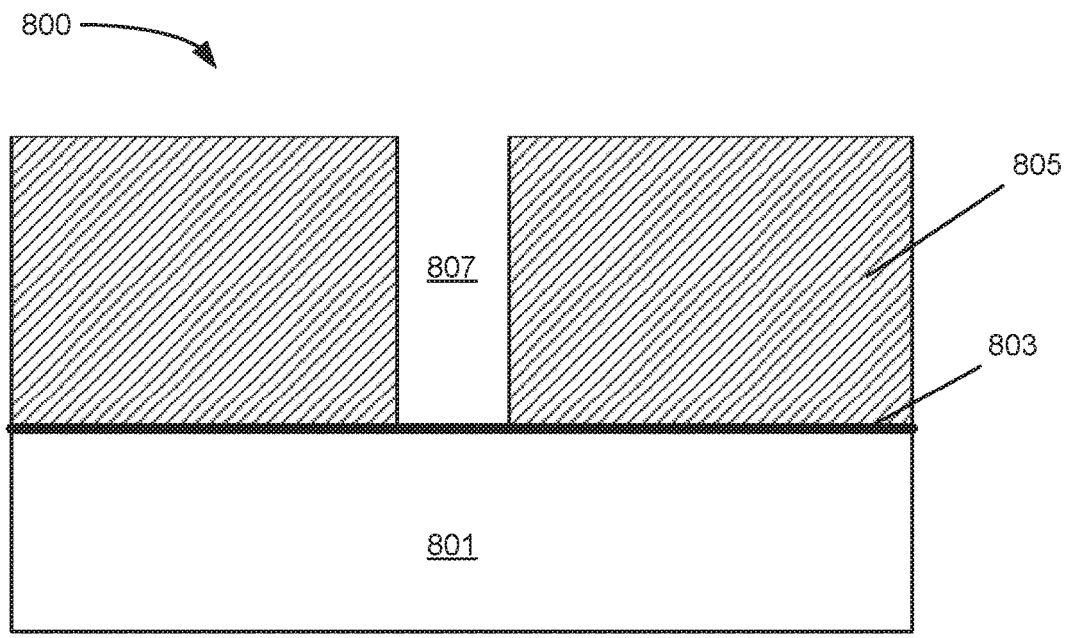
FIGS. 8A-8D show cross-sectional schematic diagrams of a substrate undergoing an electroplanarization process for improved within feature uniformity according to some implementations.

FIGS. 8A-8D show cross-sectional schematic diagrams of a substrate undergoing an electroplanarization process for improved within feature uniformity according to some implementations. In FIG. 8A, the process begins by providing a substrate 800, where the substrate 800 has a mask layer 805 patterned with a through mask recessed feature 807. The substrate 800 includes a copper seed layer 803 disposed on a layer 801, where the layer 801 can include a dielectric layer, an adhesion layer, a diffusion barrier layer, or combinations thereof.

Figure 8B:
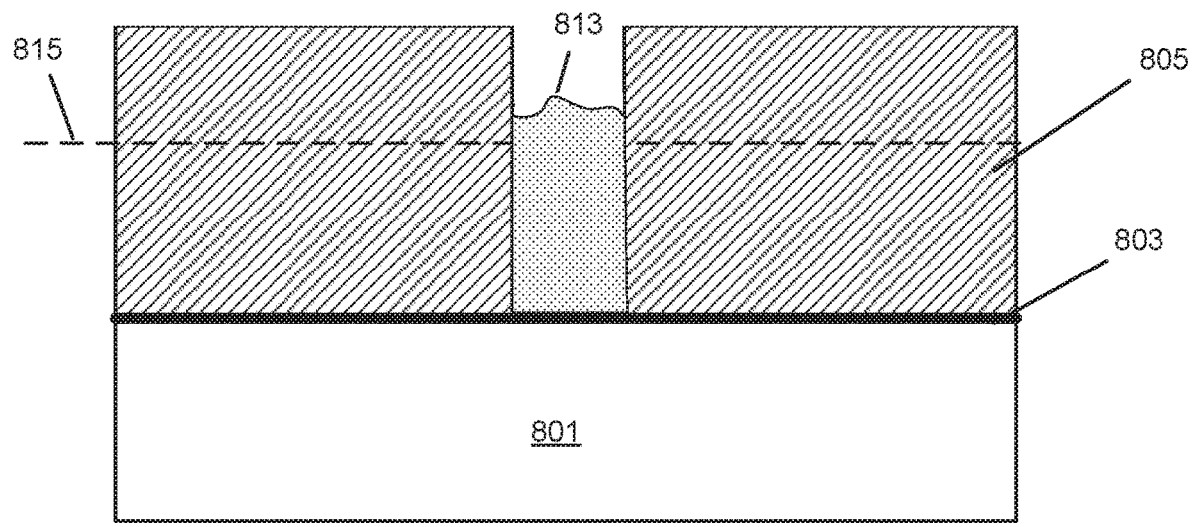

In FIG. 8B, copper 813 is electroplated into the recessed feature 807 above a target level 815. In this case, the copper 813 is uneven within the recessed feature 807 as there are thicker and thinner portions across the diameter of the recessed feature 807. Generally, within feature non-uniformity manifests itself in a variety of shapes, including but not limited to convex domed features (where the center of the plated feature is thicker than the peripheral portion of the feature), concave dished features (where the center of the plated feature is thinner than the peripheral portion of the feature), and rough features, which may include a plurality of small protrusions and recesses.

Figure 8C:
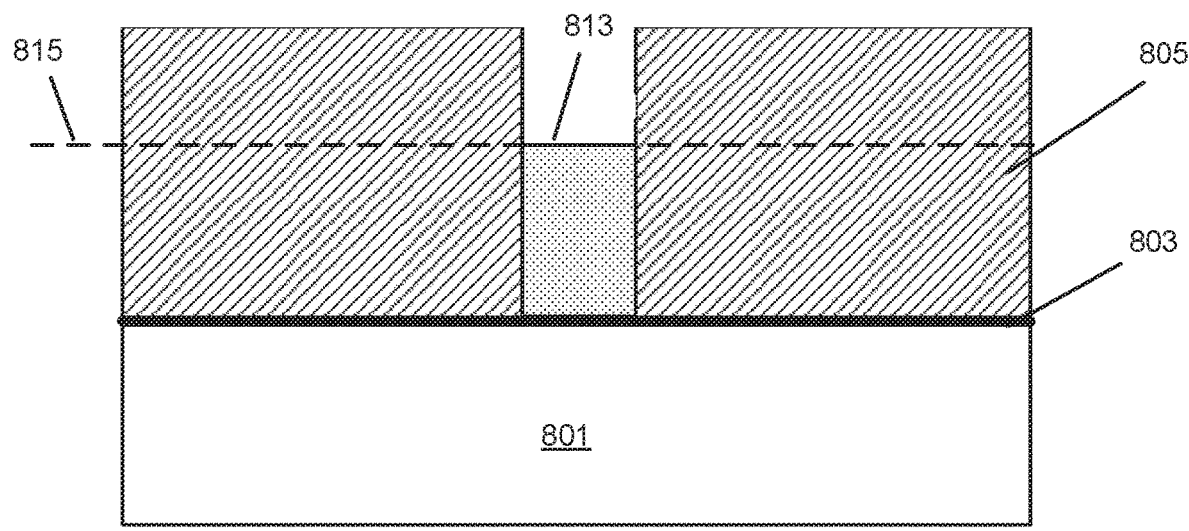

In FIG. 8C, copper 813 is electrochemically removed in the recessed feature 807 and stopped at a point where the feature thickness approaches a target thickness at the target level 815. The electrochemical removal process improves uniformity within the recessed feature 807 by reducing surface roughness so that the feature's shape is planarized at the target level 815.

Figure 8D:
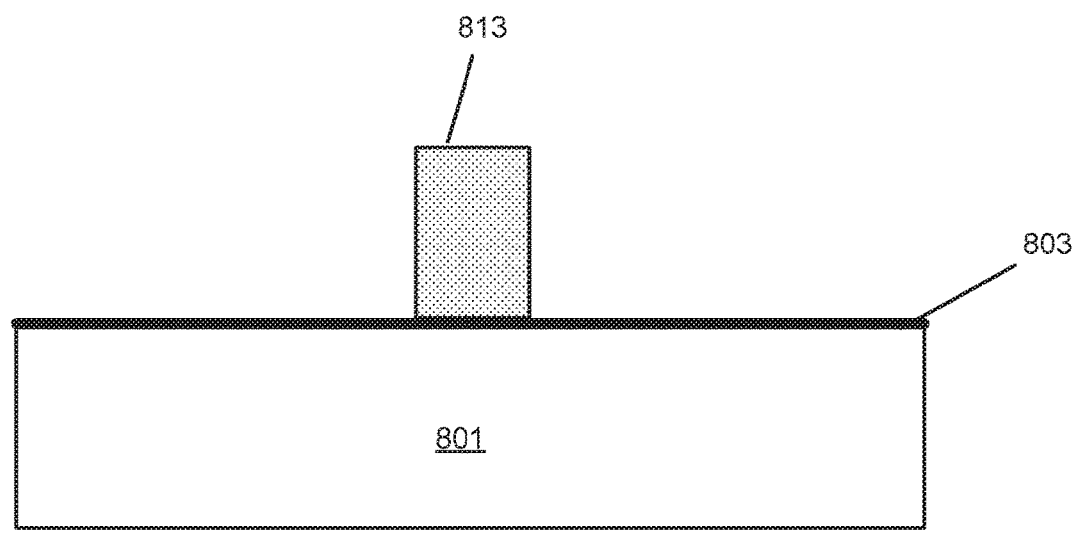

In FIG. 8D, after the electrochemical removal process is performed, the mask layer 805 is removed. The substrate 100 is left with a planarized copper feature 813 in the form of a bump or pillar. In some implementations, the copper seed layer 803 can be removed in a subsequent etching operation.

The electroplanarization process in the present disclosure may be used to improve within die uniformity (e.g., better coplanarity), within feature uniformity (e.g., reduced roughness), or both. For example, the electroplanarization process can be used to planarize filled copper features having different heights where the copper features themselves have thickness irregularities such as surface roughness. The electroplanarization process is particularly well-suited for improving uniformity of through mask plated features, where a substrate contains areas of exposed copper and areas of exposed dielectric. The methods provided herein, in some implementations, configure the electrolyte hydrodynamics at the working surface of the substrate for improving uniformity during electrochemical removal. The methods provided herein, in some implementations, also configure the electrochemical regime, via controlling potential and/or current at the substrate, for improved uniformity. The methods provided herein, in some implementations, also configure the composition of the electrolyte for improving the uniformity of the electrochemical removal process. These aspects of the methods provided herein can be used separately or in combination with each other.

In some implementations, the flow of the electrolyte at the working surface of the substrate is a transverse flow of electrolyte contacting the working surface of the substrate. The use of transverse flow may allow for improving the uniformity of copper features during electrochemical copper removal, as it facilitates mass transfer of the electrolyte to and from the copper features. The transverse flow of the electrolyte is a flow of the electrolyte in a direction that is substantially parallel to the working surface of the substrate. While not wishing to be bound by any particular model or theory, it is believed that when copper features are recessed below a plane of a dielectric or mask layer, transverse flow in the region above the surface creates a circulatory irrigating flow pattern inside recessed features, which leads to enhanced mass transfer and processing rates. In some implementations, the transverse flow is provided during the entire electrochemical copper removal process. For example, the transverse flow can be provided for at least 50% or at least 80% of the time that the electrochemical copper removal process is conducted. In some implementations, it may be desirable to rotate the substrate during electrochemical copper removal with transverse flow.

The electrolyte used in the electroplanarization process is an electrically conductive liquid, which typically contains a copper salt and an acid. In some implementations, the acid includes a phosphoric acid ($H_3PO_4$), 1-hydroxyethylidene-1,1 diphosphonic acid (HEDP), or combinations thereof. In some implementations, a non-acidic viscosity thickening agent, such as glycerol or ethylene glycol, can be included in the electrolyte. The use of phosphoric acid or HEDP may be used for electrochemically removing copper because the use of such acids generally does not result in precipitation of metallic copper from solution. However, the use of sulfuric acid during electrochemical copper removal can result information of significant amounts of metallic copper particles. In some implementations, the electrolyte contains phosphoric acid at a concentration greater than 40% by weight, such as greater than 45% by weight, e.g., between about 40% and about 65% by weight.

In some implementations, the viscosity of the electrolyte is greater than about 4 centipoise, such as between about 5 centipoise and about 12 centipoise. In some implementations, the electrolyte composition is selected such that its viscosity increases rapidly and significantly with an increase in copper ion concentration. As the electrochemical removal proceeds, the concentration of copper ion in the electrolyte will increase near the working surface of the substrate. If the electrolyte is configured such that the viscosity also increases with the increase in copper ion concentration, the diffusion in a layer near the working surface will appreciably decrease and the process will lead to better uniformity within features and between features of different heights. Without wishing to be bound by any particular theory, it is believed that when electroplanarization is performed in a solution where viscosity increases with the concentration of polished copper, the rate of diffusion will decrease with increasing copper content near the copper surface, until a mass-transfer limiting layer is formed in the electrolyte near the interface with the copper surface, thereby limiting the mass transfer rate of the planarization process. Electrolytes containing phosphoric acid and/or HEDP may fulfill the requirement for copper concentration dependent viscosity change.

The electrolyte used in the electroplanarization process typically includes a copper salt in solution so that copper ions are included in the beginning and throughout the electrochemical copper removal process. In some implementations, in the beginning of electrochemical copper removal (at the time of substrate immersion), the concentration of copper ions is in a range of between about 0.1 moles/liter and about 2 moles/liter, or between about 0.2 moles/liter and about 1.5 moles/liter. In one implementation, the electrolyte contains or consists essentially of an aqueous solution of copper (II) phosphate (including all types of phosphates, such as biphosphate) and phosphoric acid. In another implementation the electrolyte contains or consists essentially of an aqueous solution of a copper salt of HEDP, and HEDP. In some implementations, the electrolyte is prepared by dissolving a metal oxide or hydroxide, for example copper (II) oxide or copper (II) hydroxide, in an acid (e.g., in phosphoric acid). For example, a copper phosphate solution can be prepared by dissolving copper (II) hydroxide in an aqueous phosphoric acid. The acid reacts with the oxide or hydroxide to form the copper salt of the acid, and water. In some implementations, a method of preparing electrolyte includes dissolving metal oxide and/or hydroxide (e.g., copper oxide or copper hydroxide) in an acid, and then combining the formed solution with a more concentrated acid. For example, copper oxide and/or hydroxide may be dissolved in a dilute phosphoric acid, and then combined with a more concentrated phosphoric acid. In some implementations, additives such as methanesulfonic acid, chloride, and a plating suppressor may be optionally included in the electrolyte.

In some implementations, electrolyte temperature may be controlled. Changes in temperature can change both the heterogeneous reaction processes as well as the properties of the electrolyte (e.g. conductivity and viscosity). In some implementations, electrolyte temperature can be between about 20° C. and about 45° C.

In some implementations, the electrolyte composition used during electroplanarization is substantially different from the electroplating solution used during electroplating of copper features. For example, the electroplating solution comprises an acid such as sulfuric acid, copper salts such as copper sulfate, and one or more additives such as suppressors, accelerators, levelers, or combinations thereof. However, the electrolyte used during electroplanarization is different, where the primary acid (e.g., sulfuric acid) used in electroplating is absent in electroplanarization or at least in significantly less amounts in electroplanarization. Specifically, the electrolyte used during electroplanarization may contain phosphoric acid and/or HEDP as the primary acids. Other differences between the electrolyte used in electroplanarization and the electroplating solution may be that the electrolyte includes organic additives at different concentrations than in typical electroplating solutions and/or includes organic additives not usually found in typical electroplating solutions.

When anodically biasing the substrate during electroplanarization, the substrate potential may be controlled so that electrochemical copper removal is conducted in two distinct electrochemical regimes: electroetching regime and electropolishing regime. In the electroetching regime, the rates of copper removal are primarily governed by ohmic resistances in the electrolyte; that is, by how the distribution of current arranges itself due to resistance in the electrolyte and the associated spatial distribution of the electric field. Thus, for example, in an electroetching regime copper features that are less recessed have a greater number of three-dimensional current paths emanating from them from the electrolyte, have a lower ionic resistance, and therefore experience greater ionic current and will etch at faster rates. Thus, a more isolated recessed feature and a feature having greater height (less recessed) will etch at a greater etch rate than for less isolated recessed features and features having less height (more recessed). In the electropolishing regime, the rates of copper removal are primarily governed by mass transport limitations related to the formation of a highly viscous film and the associated mass transport-resistant layer formed at the feature-electrolyte interface and in the recessed features at sufficiently high potentials and suitable convection conditions. In the electropolishing regime, the rates of copper removal are not significantly dependent on applied potential or electric field distribution in the electrolyte to and around the feature, hut are dependent on an exposure of a particular feature to mass transfer limiting diffusive and convective processes. Thus, the rates of copper removal in less recessed features are greater than in more recessed features. Moreover, within a single feature, thicker (higher-lying), more exposed portions of a feature experience greater rates of copper removal than relatively thinner (lower-lying) portions. If electropolishing continues until a feature becomes significantly more recessed, the rate of copper removal from the feature becomes reduced. In some implementations, electropolishing comprises electrochemically removing copper from a feature or a protrusion within a feature, where the rate of copper removal is greater in the beginning of electropolishing than towards the end. So as electropolishing proceeds, the features get deeper and less exposed, and the rates of copper removal decrease, which eventually would result in a decrease of the feature height difference. Also, higher-lying portions are etched faster than lower-lying portions, and so the shape within each feature becomes substantially flatter. Electroetching and electropolishing regimes provide a set of tools for improving different types of uniformity.

Figure 9:
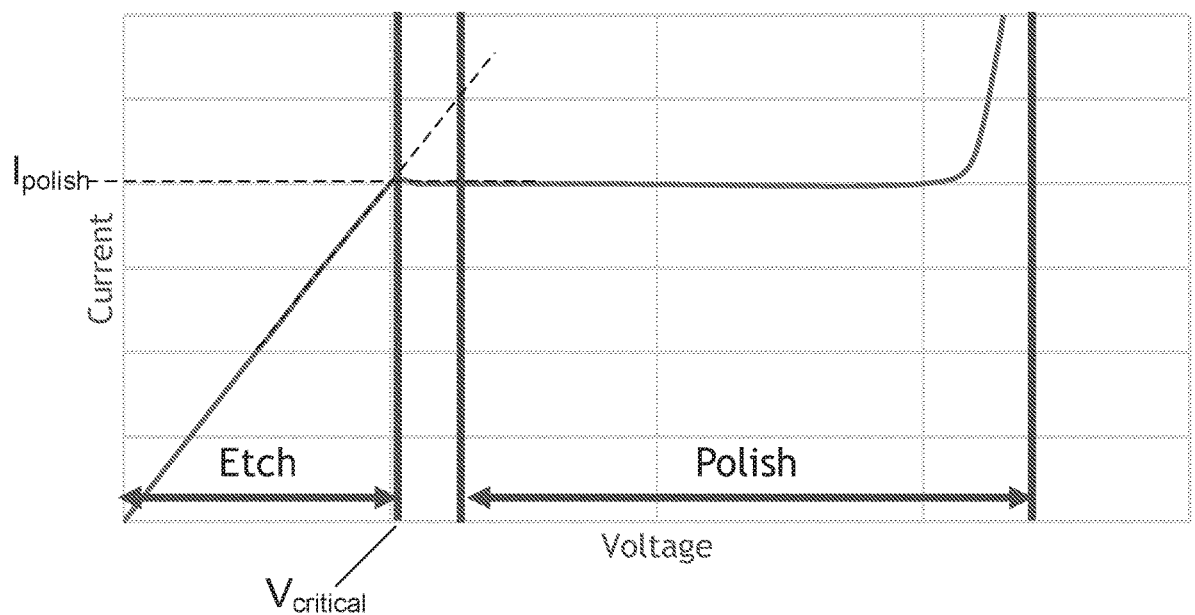
FIG. 9 shows a current-voltage (I-V) diagram having electroetching and electropolishing regimes divided by a critical potential.

Electroetching and electropolishing differ in the substrate potential in which they occur. Electroetching occurs when the substrate is maintained at below a critical potential during electrochemical removal, and electropolishing occurs when the substrate potential is maintained above the critical potential during electrochemical removal. FIG. 9 shows a current-voltage (I-V) diagram having electroetching and electropolishing regimes divided by a critical potential. The etch regime is the regime starting anodic of copper equilibrium potential in the electrolyte. In this regime, the current increases with applied potential. Further increases in potential lead to a transition into the polish regime. In some implementations, the electroetching of copper can be conducted at a potential between about 0.1 V and about 0.7 V, where the potential is measured relative to a copper reference electrode. The polish regime is the regime in which current remains substantially constant over a range of applied potentials. In some implementations, the electropolishing of copper is conducted at a potential between about 0.7 V and about 2.0 V, where the potential is measured relative to a copper reference electrode. The critical potential can be estimated as the potential corresponding to an intersection of two tangent lines, where the first tangent is drawn to the current plateau region, and the second tangent is drawn to the fast current growth region. The critical potential depends not only on the electrolyte composition, but also on electrolyte temperature and the transverse flow rate of the electrolyte.

An electroetching regime or electropolishing regime may be selected using potential control. While electroetching provides for fast improvement in uniformity, in some implementations, it may be desired to sequentially perform electropolishing after electroetching. This may be because electroetching may lead to a relatively rough surface on copper features. Furthermore, in some cases, electroetching can lead to overetching of features, whereas electropolishing tends to be more self-regulating; less deep features are removed faster than more deep features, but as the depth of the features become similar, the rates of removal between the two features become similar. Alternatively, in some implementations, electroetching may be performed and stopped before a plurality of copper features reach a target level, and the electrochemical removal regime is switched to electropolishing. Eventually, the plurality of copper features are planarized to be substantially coplanar and polished to be substantially smooth. In some implementations, electroplanarization can follow this two-step process of electroetching followed by electropolishing. In some implementations, electroplanarization can proceed by electropolishing only. It is noted that while the method involves electroetching below the critical potential, and electropolishing above the critical potential, the critical potential itself is dependent on process conditions such as on electrolyte composition, transverse electrolyte flow rate, and temperature.

In some implementations, electroplanarization is conducted while maintaining a homeostasis of electrolyte components during the course of electrochemical copper removal on a substrate. Maintaining homeostasis may be important so as to maintain a predictable and constant set of substrate processing results and involves controlling concentrations of one or more components of the electrolyte such that the concentrations do not fluctuate from a target concentration by more than a small defined amount. In some implementations, during electrochemical copper removal, the concentration of copper ions is maintained such that it does not fluctuate by more than 5% from the copper target level, or by more than 2.5% from the copper target level. In some implementations, during electrochemical copper removal, the concentration of acid does not fluctuate by more than 2% from the acid target level, or by more than 0.5% from the acid target level. In some implementations, the concentration of copper ions or the copper target level is at least about 10 g/L, at least about 30 g/L, or between about 30 g/L and about 80 g/L. In some implementations, the concentration of acid or the acid target level is at least about 150 g/L, at least about 200 g/L, or between about 200 g/L and about 1350 g/L. The concentrations of the copper ions and of the acid may be measured continuously through the electrochemical copper removal process. The concentrations of one or more components in the electrolyte are maintained within a tolerable range throughout the duration of electrochemical copper removal on the substrate. Additional substrates may be sequentially processed while maintaining the concentrations of the one or more components within the tolerable range.

In some implementations, viscosity is maintained at a substantially constant level during the course of electrochemical copper removal. This can occur without measuring concentrations of electrolyte components and without deliberately keeping the concentrations of electrolyte components at a constant level. Viscosity can be modulated by adding a less viscous fluid and/or raising temperature if viscosity is higher than desired. Likewise, viscosity can be modulated by evaporating water from the electrolyte, adding a more viscous fluid, and/or reducing temperature if viscosity is lower than desired. The viscosity can be maintained so that it does not deviate by more than a predetermined amount from a target value.

Figure 10A:
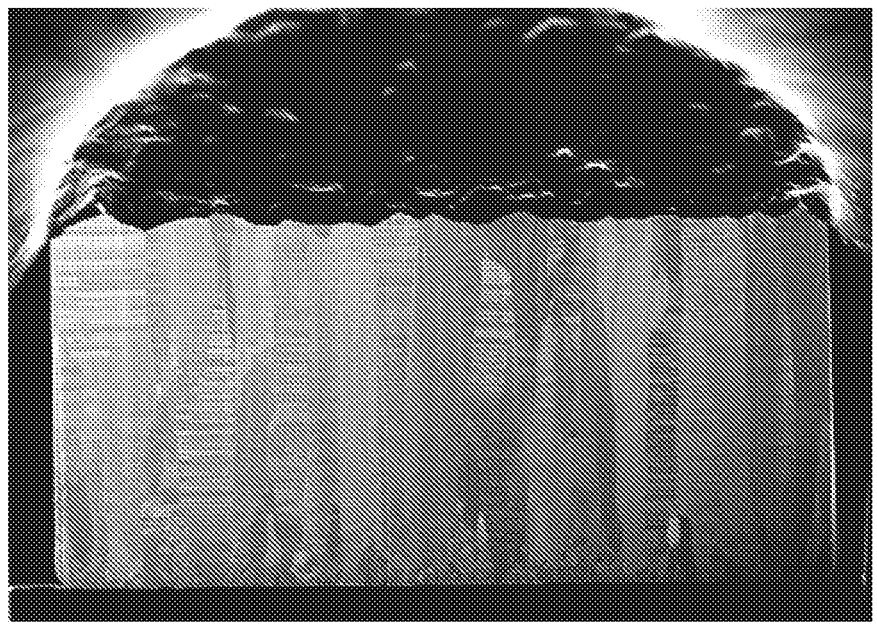
FIG. 10A shows an SEM image of a copper feature without performing an electroplanarization process.
Figure 10B:
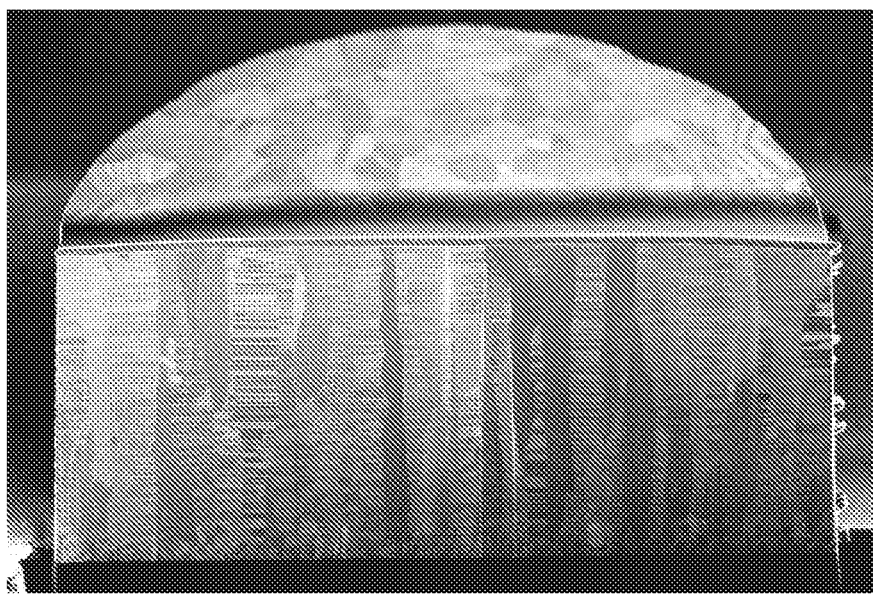
FIG. 10B shows an SEM image of a copper feature having performed an electroplanarization process.

FIG. 10A shows an SEM image of a copper feature without performing an electroplanarization process. The copper feature is a copper pillar obtained after recessed features of a photoresist mask are electrofilled. It can be seen that the top surface is very uneven and domed in shape. FIG. 10B shows an SEM image of a copper feature having performed an electroplanarization process. The copper feature is a copper pillar obtained after recessed features of a photoresist mask are electrofilled. It can be seen that almost all height variation is removed by electroplanarization so that a very smooth surface is obtained.

Returning to FIG. 4, at block 430 of the process 400, the plurality of first copper features are optionally directly bonded with a plurality of second copper features on a second substrate to connect the first substrate and the second substrate. In some implementations, the process 400 further includes forming the plurality of second copper features on the second substrate, each of the plurality of second copper features having nanotwinned copper structures, and electroplanarizing the plurality of second copper features by electrochemically removing a portion of exposed copper from the second copper features. The plurality of first copper features on the first substrate are aligned opposite with the plurality of second copper features on the second substrate. The plurality of first copper features and the plurality of second copper features are directly bonded at a low temperature, such as a temperature less than about 250° C., at a temperature between about 150° C. and about 250° C., at a temperature between about 25° C. and about 250° C., or at a temperature between about 25° C. and about 150° C. In some implementations, the plurality of first copper features and the plurality of second copper features are directly bonded in an ordinary vacuum, where the pressure may be between about $10^{-5}$ torr and about 10 torr, or between about $10^{-4}$ torr and about 1 torr, or between about $10^{-3}$ torr and about 0.1 torr. In some implementations, an amount of applied stress for directly bonding is between about 50 psi and about 200 psi, or between about 75 psi and about 150 psi. In some implementations, a duration of the applied stress for direct bonding is between about 5 minutes and about 120 minutes, or between about 10 minutes and about 60 minutes. With the electroplating and electroplanarization process described in the present disclosure, direct bonding of first copper features with second copper features may be achieved at low temperatures, ordinary vacuum, moderate applied stress, and short duration. In some implementations, direct bonding of first copper features with second copper features may result, for example, in a copper-copper bonding structure as shown in FIG. 1A.

Apparatus for Electroplating

Figure 11:
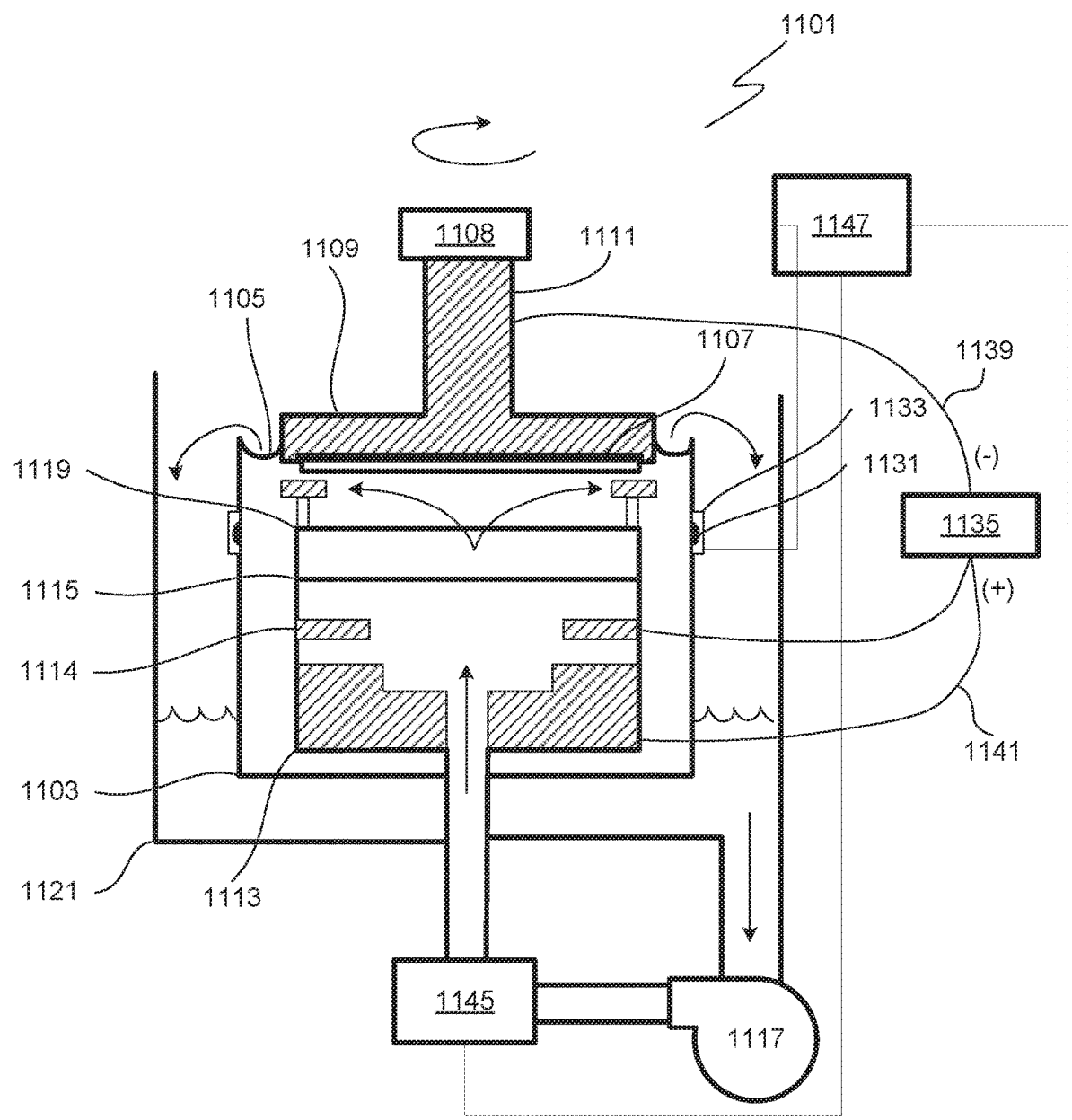
FIG. 11 shows a schematic diagram of an example of an electroplating cell in which electroplating may occur according to some implementations.
Figure 12:
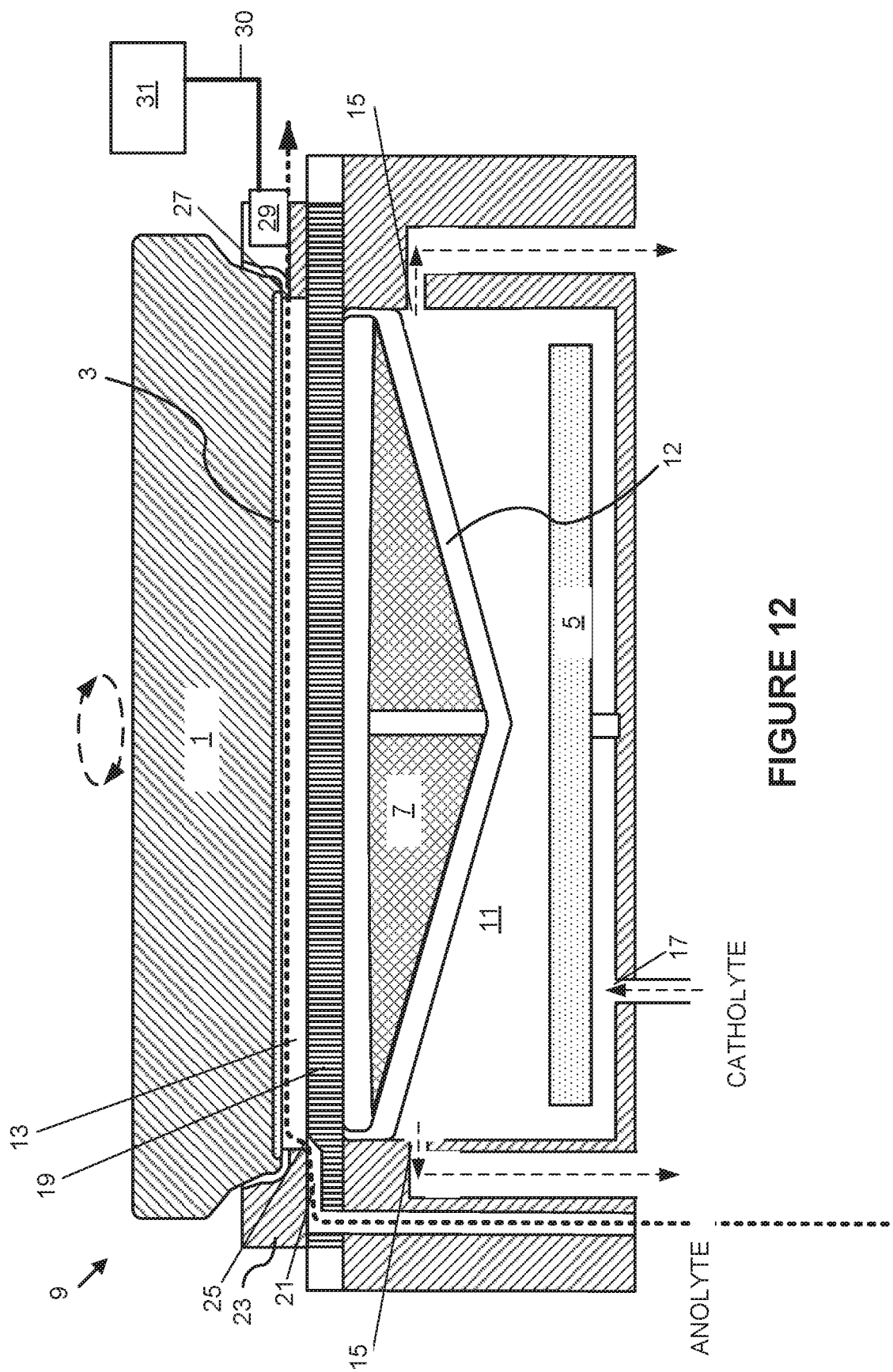
FIG. 12 shows a schematic diagram of an example of a deplating cell in which electrochemical removal may occur according to some implementations.

Many apparatus configurations may be used in accordance with the implementations described herein. Electroplating operations as described in the present disclosure may be performed in an electroplating cell of an electroplating apparatus as shown in FIG. 11. Electroplanarization operations as described in the present disclosure may be performed in a depleting cell of an electrochemical metal removal apparatus as shown in FIG. 12. However, it will be appreciated that electroplating operations and electroplanarization operations may be integrated within the same tool platform, which is demonstrated in FIGS. 13 and 14.

FIG. 11 shows a schematic diagram of an example of an electroplating cell in which electroplating may occur according to some implementations. Often, an electroplating apparatus includes one or more electroplating cells in which the substrates (e.g., wafers) are processed. Only one electroplating cell is shown in FIG. 11 to preserve clarity. To optimize bottom-up electroplating, additives may be added to the electroplating solution; however, an electroplating solution with accelerators may inhibit growth of nanotwins in copper structures unless deposited on a highly-oriented base layer.

An implementation of an electroplating apparatus 1101 is shown in FIG. 11. A plating bath 1103 contains the electroplating solution (having a composition as discussed herein), which is shown at a level 1105. A substrate 1107 is immersed into the electroplating solution and is held by, e.g., a "clamshell" substrate holder 1109, mounted on a rotatable spindle 1111, which allows rotation of clamshell substrate holder 1109 together with the substrate 1107. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated by reference in their entireties and for all purposes.

An anode 1113 is disposed below the substrate 1107 within the plating bath 1103 and is separated from the substrate region by a membrane 1115, preferably an ion selective membrane. For example, Nafion™ cationic exchange membrane (CEM) may be used. The region below the anodic membrane is often referred to as an "anode chamber." The ion-selective anode membrane 1115 allows ionic communication between the anodic and cathodic regions of the plating cell, while preventing the particles generated at the anode from entering the proximity of the substrate 1107 and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated by reference in their entireties and for all purposes. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating, the ions from the electroplating solution are deposited on the substrate 1107. The copper ions must diffuse through the diffusion boundary layer and into the TSV hole or other feature. A typical way to assist the diffusion is through convection flow of the electroplating solution provided by a pump 1117. Additionally, a vibration agitation or sonic agitation member may be used as well as substrate rotation. For example, a vibration transducer 1108 may be attached to the clamshell substrate holder 1109.

The electroplating solution is continuously provided to plating bath 1103 by the pump 1117. Generally, the electroplating solution flows upwards through an anode membrane 1115 and a diffuser plate 1119 to the center of substrate 1107 and then radially outward and across substrate 1107. The electroplating solution also may be provided into the anodic region of the bath from the side of the plating bath 1103. The electroplating solution then overflows plating bath 1103 to an overflow reservoir 1121. The electroplating solution is then filtered (not shown) and returned to pump 1117 completing the recirculation of the electroplating solution. In certain configurations of the plating cell, a distinct electrolyte is circulated through the portion of the plating cell in which the anode is contained while mixing with the main electroplating solution is prevented using sparingly permeable membranes or ion selective membranes.

A reference electrode 1131 is located on the outside of the plating bath 1103 in a separate chamber 1133, which chamber is replenished by overflow from the main plating bath 1103. Alternatively, in some implementations, the reference electrode 1131 is positioned as close to the substrate surface as possible, and the reference electrode chamber is connected via a capillary tube or by another method, to the side of the substrate 1107 or directly under the substrate 1107. In some implementations, the electroplating apparatus 1101 further includes contact sense leads that connect to the substrate periphery and which are configured to sense the potential of the copper seed layer at the periphery of the substrate 1107 but do not carry any current to the substrate 1107.

A DC power supply 1135 can be used to control current flow to the substrate 1107. The power supply 1135 has a negative output lead 1139 electrically connected to substrate 1107 through one or more slip rings, brushes and contacts (not shown). The positive output lead 1141 of power supply 1135 is electrically connected to an anode 1113 located in plating bath 1103. The power supply 1135, a reference electrode 1131, and a contact sense lead (not shown) can be connected to a system controller 1147, which allows, among other functions, modulation of current and potential provided to the elements of electroplating cell. For example, the controller 1147 may allow electroplating in potential-controlled and current-controlled regimes. The controller 1147 may include program instructions specifying current and voltage levels that need to be applied to various elements of the plating cell, as well as times at which these levels need to be changed. When forward current is applied, the power supply 1135 biases the substrate 1107 to have a negative potential relative to anode 1113. This causes an electrical current to flow from anode 1113 to the substrate 1107, and an electrochemical reduction (e.g. $Cu^{2+}+2\ e^-=Cu^0$) occurs on the substrate surface (the cathode), which results in the deposition of the electrically conductive layer (e.g. copper) on the surfaces of the substrate 1107. An inert anode 1114 may be installed below the substrate 1107 within the plating bath 1103 and separated from the substrate region by the membrane 1115.

The electroplating apparatus 1101 may also include a heater 1145 for maintaining the temperature of the electroplating solution at a specific level. The electroplating solution may be used to transfer the heat to the other elements of the plating bath 1103. For example, when a substrate 1107 is loaded into the plating bath 1103, the heater 1145 and the pump 1117 may be turned on to circulate the electroplating solution through the electroplating apparatus 1101, until the temperature throughout the electroplating apparatus 1101 becomes substantially uniform. In some implementations, the heater 1145 is connected to the system controller 1147. The system controller 1147 may be connected to a thermocouple to receive feedback of the electroplating solution temperature within the electroplating apparatus 1101 and determine the need for additional heating.

The electrodeposition methods disclosed herein can be described in reference to, and may be employed in the context of, various electroplating tool apparatuses. One example of a plating apparatus that may be used according to the embodiments herein is the Lam Research Sabre® tool. Electroplating, electroplanarization, and other methods disclosed herein can be performed in components that form a larger electroplating/depleting apparatus.

Electroplanarization methods described herein can be implemented in an electrochemical metal removal apparatus having a vessel configured for holding an electrolyte and a cathode, and a substrate holder configured to hold a substrate such that the working surface of the substrate is immersed into the electrolyte and is separated from the cathode during the electrochemical metal removal. The electrochemical metal removal apparatus includes a power supply and electrical connections configured for negatively biasing the cathode and positively biasing the substrate during electrochemical metal removal. In some implementations, the electrochemical metal removal apparatus further includes a mechanism configured to provide a transverse flow of the electrolyte contacting the working surface of the substrate in a direction that is substantially parallel to the working surface of the substrate during the electrochemical metal removal. In some implementations, the electrochemical metal removal apparatus includes a reference electrode configured for measuring a potential in the vicinity of the substrate (e.g., within about 5 mm of the substrate) or an equivalent potential. The electrochemical metal removal apparatus in some implementations may include a separator positioned between the cathode and the substrate holder, thereby defining an anode chamber and the cathode chamber, where the separator is configured to block any $H_2$ bubbles or particles formed at the cathode from crossing the separator and reaching the substrate. The separator is permeable to ionic species of the electrolyte and allows for ionic communication between the anode and cathode chambers. The electrochemical metal removal apparatus may be configured for safely segregating the $H_2$ or particles in the cathode chamber and removing them through one or more openings in the cathode chamber proximate the separator membrane.

FIG. 12 shows a schematic diagram of an example of a deplating cell in which electrochemical removal may occur according to some implementations. A deplating cell 9 includes a substrate holder 1 configured to hold and rotate a substrate 3. A plurality of electrical contacts are provided around the circumference of the substrate 3. The contacts are electrically connected to a power supply (not shown), that positively (anodically) biases the substrate 3 during electrochemical metal removal. A cathode 5 is positioned below the substrate 3 and is electrically connected to the power supply (not shown) that negatively biases it during the electrochemical metal removal. Different types cathodes can be used, including cathodes made of the same metal that is being removed (e.g., a copper cathode during copper metal removal), plateable metals (e.g. stainless steel) and inert cathodes. Inert hydrogen generating cathodes are used in some implementations because an active cathode may react with or dissolve in some electrolytes or plate a non-adherent or dendritic particle-generating layer of copper, leading to an unavoidable increase in copper ion concentration of the electrolyte or formation of a copper-containing sludge. In other implementations, an active cathode does not react with the electrolyte chemically and is used because the copper removed from the substrate 3 is plated onto the active cathode, and the overall cell chemical reactions are balanced and the cost of the process is thereby reduced as there would be little or no demand for solution replacement based on copper depletion.

A conically-shaped membrane 7 is positioned between the cathode 5 and the anodic substrate 3 dividing the deplating cell 9 into a cathode chamber 11 and an anode chamber 13. The membrane 7 is mounted on a frame 12 such that the vertex of the cone is closer to the cathode 5 than the base of the cone. The membrane material does not allow $H_2$ bubbles formed at the cathode 5 to cross from the cathode chamber 11 into the anode chamber 13. The membrane 7 may be made of an ion-permeable material, such as an ion-permeable polymer. In some implementations, hydrophilic polymers such as polymers containing —$SO_2$-functional group are used. In some implementations, the membrane materials include polyethersulfone (PES), polyphenylsulfone, and other polymers from the polysulfone family. Hydrophilic membrane bubble separating materials may be used because bubbles adhere less to these materials than to hydrophobic membranes. The conical shape of the membrane 7 allows the $H_2$ bubbles released at the cathode 5 to travel upward and radially outward along the membrane surface and toward the periphery of the cathode chamber 11, accumulating at the interface between the membrane 7 and the cathode chamber sidewall.

An outlet 15 is positioned in the cathode chamber sidewall in close proximity to the junction between the membrane 7 and the sidewall, and is configured for removing the accumulated $H_2$ bubbles in a mixture with catholyte. For example, the outlet 15 is positioned within about 1 mm, and in some implementations without any gap from the junction of the membrane assembly with the sidewalls of the cathode chamber 11. The outlet 15, in some implementations, includes a plurality of openings positioned around the circumference of the cathode chamber sidewall at substantially identical small intervals, such as eight openings equally spaced around the chamber at 45° intervals. In some implementations this outlet 15 is a continuous slot in the wall. In one implementation, a continuous slot around the perimeter of the deplating cell 9 leads to a plurality of equally spaced holes that act as electrolyte outlets.

The cathode chamber 11 further includes an inlet ich is configured to receive the catholyte. In the depicted implementation, the catholyte inlet 17 is located below the cathode 5. Generally, it is desired to position the catholyte inlet 17 below the catholyte outlet such that catholyte entering the cathode chamber 11 will flow up and around the cathode 5 (or through a perforated or porous cathode), as this will facilitate the movement of catholyte and movement of the bubbles in an upward direction, as well as prevent a large difference in composition between the electrolyte in the cathode chamber 11 and the electrolyte near the cathode 5.

The anode chamber 13 is located above the membrane 7 and houses the anodically biased substrate 3. In the depicted implementation, an ionically resistive ionically permeable element 19 (the "element") is positioned in the anode chamber 13 between the membrane 7 and the substrate holder 1. The ionically resistive ionically permeable element 19 may be substantially coextensive with the substrate 3 and located in close proximity to the substrate's working surface during electrochemical metal removal. The element 19 has a substrate-facing surface and an opposing surface, and is located such that the closest distance between the substrate-facing surface to the working surface of the substrate 3 during the electrochemical metal removal is about 10 mm or less. In the illustrated implementation, the substrate-facing surface of the element 19 is planar, but in other implementations, the element 19 may be, for example, convex, with a smaller distance to the substrate 3 at the center than at the periphery. The element 19 is made of a dielectric material having pores, where the porosity of the element 19 may be relatively low, such that the element 19 introduces a substantial resistance on the path of ionic current in the system. In some implementations, the element 19 includes a plurality of non-communicating channels that allow for electrolyte to travel through the element 19. The element 19 may be useful for reducing radial non-uniformity that can appear during electrochemical metal removal due to a terminal effect. The ionically resistive ionically permeable element 19 can serve as a high ionic resistance plate for making field distribution more uniform and to reduce the terminal effect, thereby improving radial uniformity in metal removal. In some implementations, the element 19 further plays a role in shaping the flow of electrolyte in the vicinity of the substrate 3. For example it may serve to provide a narrow gap between the substrate-facing surface of the element 19 and the working surface of the substrate 3 into which the electrolyte is laterally injected. This arrangement facilitates the transverse flow of the electrolyte near the surface of the substrate 3. The electrolyte can comprise or consist essentially of an aqueous solution of phosphoric acid and one or more copper salts of phosphoric acid (e.g., $Cu_3(PO_4)_2$). For example, the electrolyte may contain any combination of $Cu^{2+}$, $Cu^+$, $H^+$, $H_2PO_4^-$, $HPO_4^{2-}$, and $PO_4^{3-}$ ions. The anode chamber 13 houses the anodically biased substrate 3 that releases $Cu^+$ and $Cu^{2+}$ ions in the electrolyte during electrochemical copper removal. The electrolyte (anolyte) can be injected into the gap using a cross flow injection manifold 21 that is at least partially defined by a cavity in the element 19. The cross flow injection manifold 21 may be arc-shaped and positioned proximate the periphery of the substrate 3. A cross flow confinement ring 23 may be positioned proximate the periphery of the substrate 3 at least partially between the element 19 and the substrate holder 1. The cross flow confinement ring 23 at least partially defines the side of the gap between the element 19 and the substrate 3.

The anode chamber 13 has an inlet 25 to the gap adapted to receive the anolyte from source of anolyte through, for example, the cross flow injection manifold 21, and an outlet 27 to the gap adapted for removing the anolyte from the gap. The inlet 25 and the outlet 27 are positioned proximate azimuthally opposing perimeter locations of the working surface of the substrate 3 (and also proximate azimuthally opposing perimeter locations of the substrate holder 1 and proximate azimuthally opposing perimeter locations of the element 19). The inlet 25 and the outlet 27 are adapted to generate the cross-flow of electrolyte in the gap and to create or maintain transverse flow of electrolyte near the working surface of the substrate 3 during electrochemical metal removal. In some implementations, the ionically resistive ionically permeable element 19 serves the dual purpose of mitigating the terminal effect, and of restricting electrolyte flow to provide a defined space for transverse flow of the electrolyte near the substrate 3.

A reference electrode 29 is positioned above the element 19 near the periphery of the substrate holder 1. The reference electrode 29 may be positioned within about 5 cm from the surface of the substrate 3, or, at a position where a potential that is equivalent to a potential measured within 5 cm of the substrate 3 can be measured. In some implementations, the reference electrode 29 is positioned within about 5 mm of the substrate, or at a position with an equivalent or minimally different potential to that at the plane of the substrate surface. For example, the reference electrode 29 may be immersed into the electrolyte that exits the anode chamber 13. In the depicted implementation, the reference electrode 29 is made of a strip or rod of copper, where part of the electrode's surface is in direct contact with the processing electrolyte. It is advantageous to use the same metal for the reference electrode 29 as the metal that is being removed from the substrate 3 because such reference electrode would have a zero (or nearly zero) open circuit potential relative to the zero current operation point, and may also be able to operate longer and with greater stability than commonly used reference electrodes. More generally, a variety of different types of reference electrodes can be used, including but not limited to those which contain an electrolyte that is different than the electrolyte processing solution, such as a saturated calomel electrode ($Hg/Hg_2Cl_2$, or SCE), a $Hg/HgSO_4$ electrode, and a Ag/AgCl electrode. In the depicted implementation, the reference electrode 29 is positioned in the anolyte radially outward from the substrate holder 1. Such peripheral position may be used in many implementations, because the reference electrode 29 generally should not interfere with the plating current near the working surface of the substrate 3.

The reference electrode 29 and other elements of the deplating cell 9 are in electrical communication with a controller 31, which has a processor and a memory, and has program instructions for controlling the operations of the deplating cell 9. For example, an electrical connection 30 can connect the reference electrode 29 with the controller 31. The controller 31 may include program instructions for performing any of the methods described herein. The controller 31 can process the information on the potential provided by the reference electrode 29 and can adjust current and/or potential provided to the anodically biased substrate 3 in response to the measured potential, in order to control the electrochemical metal removal process. In some implementations, the reference electrode 29 is immersed in the anolyte and is positioned above (but not necessarily over) the ionically resistive ionically permeable element 19 in proximity of the substrate 3. Such position minimizes the voltage drop between the substrate 3 and the reference electrode 29 and improves the accuracy of the potential reading.

Figure 13:
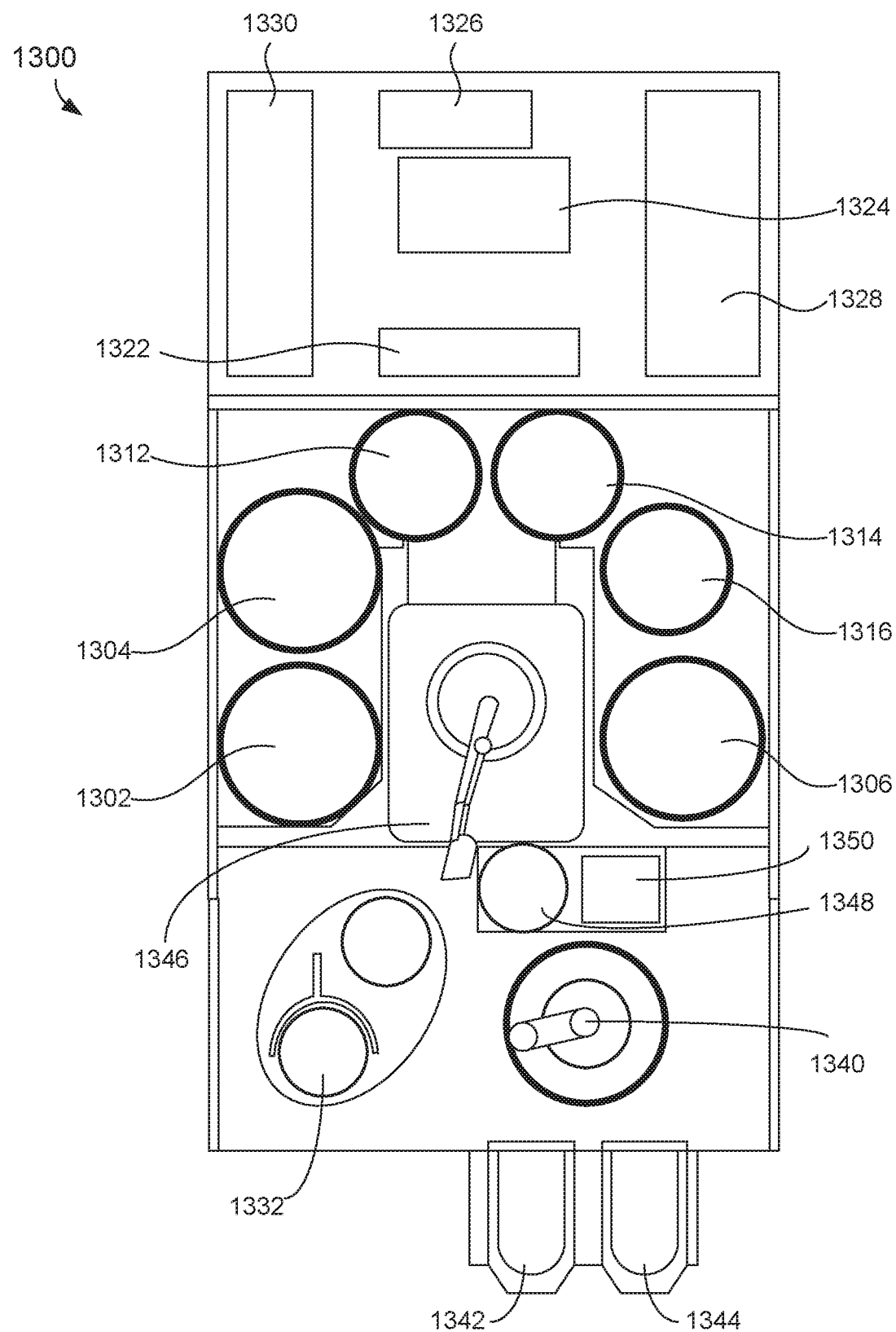
FIG. 13 shows a schematic of a top view of an example integrated system for performing electroplating and electroplanarization according to some implementations.

The apparatus for the electrochemical metal removal can be part of the system that also includes an electroplating apparatus, where the system is configured to transport the substrate to the electrochemical metal removal apparatus after electroplating. FIG. 13 shows a schematic of a top view of an example integrated system for performing electroplating and electroplanarization according to some implementations. As shown in FIG. 13, the integrated system 1300 may include multiple electroplating modules, in this case the three separate modules 1302, 1304, and 1306. Each electroplating module typically includes a cell for containing an anode and an electroplating solution during electroplating, and a substrate holder for holding the substrate in the electroplating solution and rotating the substrate during electroplating. The electroplating system 1300 shown in FIG. 13 further includes an electrochemical metal removal system which includes three separate electrochemical metal removal modules 1312, 1314, and 1316. Each of the modules includes a deplating cell configured for containing a cathode and a substrate holder, as described herein, in addition, the integrated system 1300 may include one or more post-electrofill modules (PEMs), which are not shown, but whose function may include thoroughly rinsing and/or drying the substrate of any electrolyte solution and contaminants. Depending on the implementation, each of PEMs may be employed to perform any of the following functions: edge bevel removal (EBR), backside etching, acid cleaning of substrates, rinsing and drying of substrates after they have been electrofilled by one of modules 1302, 1304, and 1306. The integrated system 1300 may also include a chemical dilution module 1322 configured to hold and deliver the diluent to the electrochemical removal modules, and a central electrolyte bath 1324 configured to hold electrolyte that is used by the electrochemical removal modules. The latter may be a tank that holds the chemical solution used as the electrolyte in the electrochemical metal removal modules. The integrated system 1300 may also include a hydrogen management system 1326 that may include one or more stilling chambers and an inert gas source that stores and delivers an inert gas to the stilling chambers. In some implementations, a filtration and pumping unit 1328 filters the electrolyte solution for central bath 1324 and pumps it to the electrochemical metal removal modules. The electroplating and/or electrochemical metal removal modules may include their own dilution and dosing module (e.g., for adding electroplating additives to the electroplating solution), their own filtration and pumping unit, and their own central electrolyte bath (not shown). In some implementations, the electrochemical metal removal modules and the electroplating modules are vertically stacked in a double-decker arrangement, with the electroplating modules occupying a first deck and the electrochemical metal removal modules occupying a different deck. In other implementations, the electroplating modules may be stacked in one section of the tool, and the electrochemical metal removal modules may be stacked in a different section of the tool.

A system controller 1330 provides electronic and interface controls required to operate the integrated system 1300. The system controller 1330 (which may include one or more physical or logical controllers) controls some or all of the properties of the integrated system 1300. The system controller 1330 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1330 or they may be provided over a network. In certain embodiments, the system controller 1330 executes system control software.

The system control software in the integrated system 1300 may include instructions for controlling the timing, mixture of electrolyte components (including the concentration of one or more electrolyte components), inlet pressure, plating/deplating cell pressure, plating/deplating cell temperature, substrate temperature, current and potential applied to the substrate and any other electrodes, substrate position, substrate rotation, and other parameters of a particular process performed by the integrated system 1300. The system control logic may also include instructions for electroplating under conditions that are tailored to be appropriate for depositing nanotwinned copper structures. For example, the system control logic may be configured to provide a pulsed current waveform and/or a pulsed current waveform followed by a constant current waveform. Further, the system control logic may be configured to provide an electroplating solution to the substrate that is free of or substantially free of accelerator additives. The system control logic may be configured to provide the electroplating solution to the substrate at a relatively low flow rate. The system control logic may further include instructions for electroplanarization under conditions that are tailored to be appropriate for achieving coplanarity and reduced surface roughness on copper features. For example, the system control logic may be configured to anodically bias the substrate to a substrate potential to perform electroetching below a critical potential followed by a substrate potential to perform electropolishing above a critical potential. System control logic may be configured in any suitable way. For example, various process tool component subroutines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some implementations, system control logic includes input/output control (IOC) sequencing instructions for controlling the various parameters described above. For example, each phase of an electroplating and/or electroplanarization process may include one or more instructions for execution by the system controller 1330. The instructions for setting process conditions for an immersion process phase may be included in a corresponding immersion recipe phase. In some embodiments, the electroplating and/or electroplanarization recipe phases may be sequentially arranged, so that all instructions for an electroplating and/or electroplanarization process phase are executed concurrently with that process phase.

The control logic may be divided into various components such as programs or sections of programs in some implementations. Examples of logic components for this purpose include a substrate positioning component, an electrolyte composition control component, a pressure control component, a heater control component, and a potential/current power supply control component.

In some implementations, there may be a user interface associated with the system controller 1330. The user interface may include a display screen, graphical software displays of the apparatus and/or process conditions, and user input devices such as pointing devices, keyboards, touch screens, microphones, etc.

In some implementations, parameters adjusted by the system controller 1330 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1330 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one implementation, the instructions can include providing the substrate in a substrate holder of an electroplating cell, cathodically biasing the substrate during immersion with an electroplating solution, and electroplating a plurality of copper features having nanotwinned copper structures on the substrate. In some implementations, the instructions can further include providing the substrate in a substrate holder of deplating cell, anodically biasing the substrate during immersion with an electrolyte, and electroplanarizing the plurality of copper features by electrochemically removing portions of exposed copper from the plurality of copper features. In some implementations, the instructions can further include transferring the substrate to a system or station configured to directly bond the first substrate with a second substrate having a plurality of second copper features disposed on the second substrate. The system or station configured to directly bond the first substrate with the second substrate may be part of the same tool platform or separate tool platform.

A hand-off tool 1340 may select a substrate from a substrate cassette such as the cassette 1342 or the cassette 1344. The cassettes 1342 or 1344 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1340 may hold the substrate using a vacuum attachment or some other attaching mechanism.

The hand-off tool 1340 may interface with a substrate handling station 1332, the cassettes 1342 or 1344, a transfer station 1350, or an aligner 1348. From the transfer station 1350, a hand-off tool 1346 may gain access to the substrate. The transfer station 1350 may be a slot or a position from and to which hand-off tools 1340 and 1346 may pass substrates without going through the aligner 1348. In some implementations, however, to ensure that a substrate is properly aligned on the hand-off tool 1346 for precision delivery to an electroplating module or electrochemical metal removal module, the hand-off tool 1146 may align the substrate with an aligner 1148. The hand-off tool 1146 may also deliver a substrate to one of the electroplating modules 1302, 1304, or 1306 or to one of the electrochemical metal removal modules 1312, 1314, and 1316 configured for various process operations.

In some implementations, a controller (e.g., system controller 1330) is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of electroplating solution, electrolyte solution, temperature settings (e.g., heating and/or cooling), pressure settings, power settings, current waveform settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of WLP features of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Figure 14:
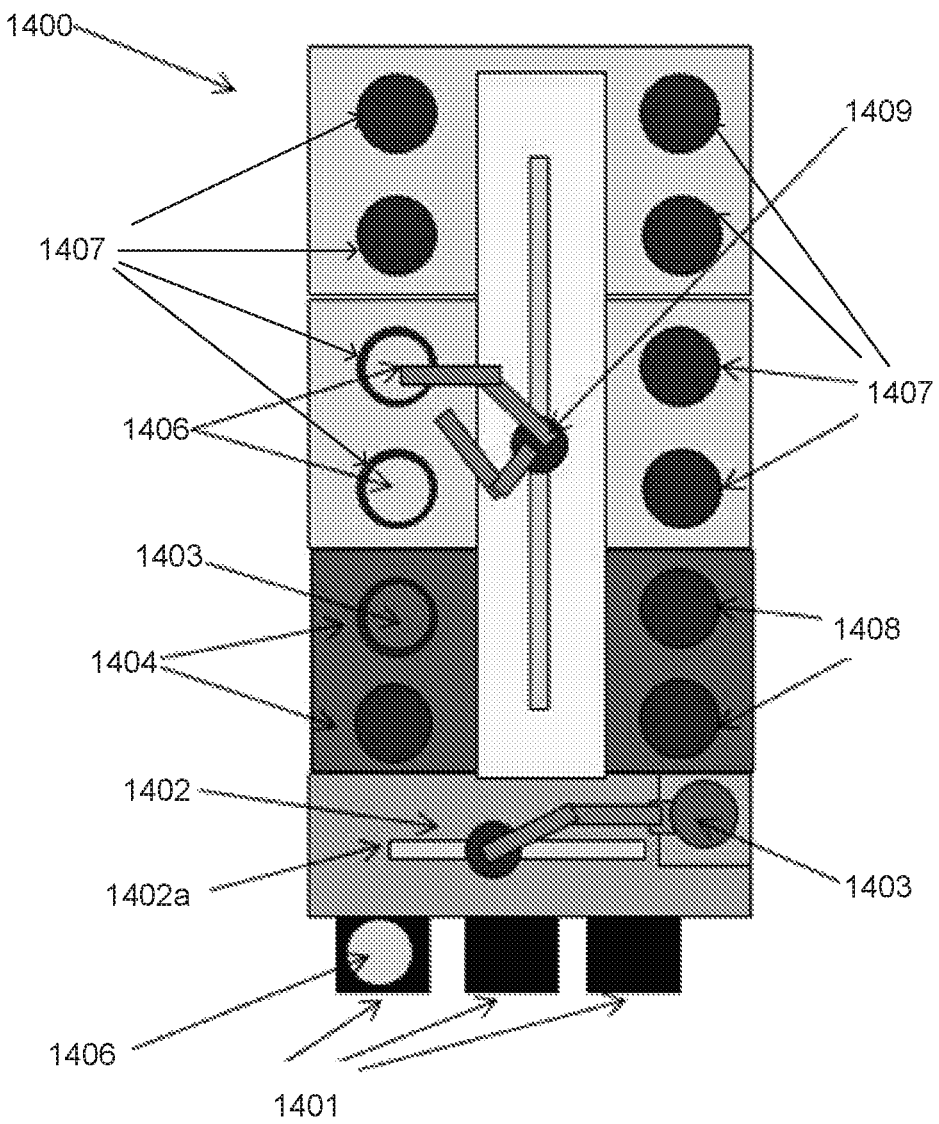
FIG. 14 shows a schematic of a top view of an alternative example integrated apparatus for performing electroplating and electroplanarization according to some implementations.

An alternative implementation of an integrated apparatus 1400 is schematically illustrated in FIG. 14. In this embodiment, the apparatus 1400 has a set of electroplating and/or electrochemical metal removal cells 1407, each containing an electrolyte-containing bath, in a paired or multiple "duet" configuration. In addition to electroplating and electrochemical metal removal per se, the apparatus 1400 may perform a variety of other electroplating or electroplanarization related processes and sub-steps, such as spin-rinsing, spin-drying, metal and silicon wet etching, electroless deposition, pre-wetting and pre-chemical treating, reducing, annealing, photoresist stripping, and surface pre-activation, for example. The apparatus 1400 is shown schematically looking top down in FIG. 14, and only a single level or "floor" is revealed in the figure, but it is to be readily understood by one having ordinary skill in the art that such an apparatus, e.g. the Sabre® 3D tool, can have two or more levels "stacked" on top of each other, each potentially having identical or different types of processing stations. In some embodiments electroplating stations and electrochemical metal removal stations are arranged on different levels of the tool. In other embodiments a single level may include both electroplating and electrochemical metal removal stations.

Referring once again to FIG. 14, the substrates 1406 that are to be electroplated are generally fed to the apparatus 1400 through a front end loading FOUP 1401 and, in this example, are brought from the FOUP to the main substrate processing area of the apparatus 1400 via a front-end robot 1402 that can retract and move a substrate 1406 driven by a spindle 1403 in multiple dimensions from one station to another of the accessible stations—two front-end accessible stations 1404 and also two front-end accessible stations 1408 are shown in this example. The front-end accessible stations 1404 and 1408 may include, for example, pretreatment stations, and spin rinse drying (SRD) stations. Lateral movement from side-to-side of the front-end robot 1402 is accomplished utilizing robot track 1402a. Each of the substrates 1406 may be held by a cup/cone assembly (not shown) driven by a spindle 1403 connected to a motor (not shown), and the motor may be attached to a mounting bracket 1409. Also shown in this example are the four "duets" of electroplating and/or electrochemical metal removal cells 1407, for a total of eight cells 1407. The electroplating cells 1407 may be used for electroplating copper for the plurality of copper features in through mask recessed features. After copper has been electroplated in one of the electroplating cells 1407, the substrate is transferred to one of the electrochemical metal removal cells 1407 either on the same level of the apparatus 1400 or on a different level of the apparatus 1400. A system controller (not shown) may be coupled to the apparatus 1400 to control some or all of the properties of the apparatus 1400. The system controller may be programmed or otherwise configured to execute instructions according to processes described earlier herein.

The apparatus/process described herein may be used in conjunction with lithographic patterning tools or processes; for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of preparing copper features for direct copper-copper bonding, the method comprising:
    forming a plurality of first copper features on a first substrate, each of the plurality of first copper features having nanotwinned copper structures; and
    electroplanarizing the plurality of first copper features by anodically biasing the first substrate, contacting the plurality of first copper features with an electrolyte, and electrochemically removing a portion of exposed copper from the first copper features prior to directly bonding the first substrate to a second substrate having a plurality of second copper features disposed on the second substrate, wherein electroplanarizing the plurality of first copper features comprises:
        electroetching copper of the plurality of first copper features below a critical potential; and
        electropolishing the copper of the plurality of first copper features above the critical potential.

2. The method of claim 1, further comprising:
    forming the plurality of second copper features on the second substrate, each of the plurality of second copper features having nanotwinned copper structures; and
    electroplanarizing the plurality of second copper features by electrochemically removing a portion of exposed copper from the second copper features.

3. The method of claim 1, wherein electroetching occurs at a potential of between about 0.1 V and about 0.7 V, and wherein electropolishing occurs at a potential of between about 0.7 V and about 2.0 V, wherein the potential is measured relative to a copper reference electrode.

4. The method of claim 1, wherein the electrolyte includes copper ions and an acid, wherein a viscosity of the electrolyte is at least about 4 centipoise.

5. The method of claim 4, wherein the acid includes phosphoric acid, 1-hydroxyethylidene-1,1 diphosphonic acid (HEDP), or combinations thereof.

6. The method of claim 4, wherein a concentration of copper ions in the electrolyte is maintained at or near a target level such that the concentration does not fluctuate by more than 5% from the target level during electrochemical removal of the portion of the exposed copper from the first copper features.

7. The method of claim 1, wherein the electrochemical removal of the portion of the exposed copper from the first copper features improves both within die uniformity and within feature uniformity.

8. The method of claim 1, wherein the plurality of first copper features are provided in through mask features of the first substrate during electrochemical removal of the portion of the exposed copper from the plurality of first copper features.

9. The method of claim 1, further comprising:
    directly bonding the plurality of first copper features with the plurality of second copper features on the second substrate to connect the first substrate and the second substrate.

10. The method of claim 9, wherein the plurality of first copper features and the plurality of second copper features are directly bonded at a temperature less than about 250° C.

11. The method of claim 1, wherein the plurality of first copper features and second copper features include copper pillars.

12. The method of claim 1, wherein forming the plurality of first copper features on the first substrate comprises:
    contacting a surface of the first substrate with an electroplating solution; and
    applying a first current to the first substrate when the first substrate is contacted with the electroplating solution to deposit the plurality of first copper features having nanotwinned copper structures, wherein the first current comprises a pulsed current waveform that alternates between a constant current and no current.

13. The method of claim 12, further comprising:
    forming, prior to contacting the first substrate with the electroplating solution, a mask layer on the first substrate having a plurality of through mask recessed features, wherein the plurality of first copper features are formed within the plurality of through mask recessed features.

14. The method of claim 12, wherein a duration of no current being applied in the pulsed current waveform is at least three times longer than a duration of constant current being applied in the pulsed current waveform.

15. The method of claim 12, wherein the pulsed current waveform alternates between the constant current being applied for a duration between about 0.1 seconds and about 2 seconds, and no current being applied for a duration between about 0.4 seconds and about 6 seconds.

16. The method of claim 12, further comprising:
applying, after applying the first current to the first substrate, a second current to the first substrate when the first substrate is contacted with the electroplating solution, wherein the second current comprises a constant current waveform.

17. The method of claim 1, wherein the first substrate comprises a copper seed layer on which the plurality of first copper features are formed, the copper seed layer having a plurality of <111> crystal grain structures.

18. The method of claim 1, wherein the first substrate comprises a diffusion barrier layer on which the plurality of first copper features are formed, the diffusion barrier layer having a plurality of columnar grain structures.

19. The method of claim 1, wherein the nanotwinned copper structures comprise a plurality of (111)-oriented nanotwinned crystal copper grains.

20. The method of claim 1, wherein forming the plurality of first copper features and electroplanarizing the plurality of first copper features are performed within the same tool.

21. An apparatus comprising:
an electroplating cell for holding an electroplating solution;
an electrochemical metal removal cell for holding an electrolyte;
a power supply for applying current to one or more substrates during electroplating and during electrochemical metal removal; and
a controller configured with instructions for performing the following operations:
form a plurality of first copper features on a first substrate in the electroplating cell, each of the plurality of first copper features having nanotwinned copper structures; and
electroplanarize the plurality of first copper features by anodically biasing the first substrate, contacting the plurality of first copper features with an electrolyte, and electrochemically removing a portion of exposed copper from the first copper features in the electrochemical metal removal cell, wherein the controller configured with instructions to electroplanarize the plurality of first copper features is configured with instructions to:
electroetch copper of the plurality of first copper features below a critical potential; and
electropolish the copper of the plurality of first copper features above the critical potential.

22. The apparatus of claim 21, wherein the controller is further configured with instructions for performing the following operations:
directly bond the plurality of first copper features with a plurality of second copper features on a second substrate to connect the first substrate and the second substrate.

23. The apparatus of claim 22, wherein the plurality of first copper features and the plurality of second copper features are directly bonded at a temperature less than about 250° C.

24. The apparatus of claim 21, wherein the controller is further configured with instructions for performing the following operations:
transfer the first substrate to a system configured to directly bond the first substrate with a second substrate having a plurality of second copper features disposed on the second substrate.

25. The apparatus of any one of claim 21, wherein the controller configured with instructions to form the plurality of first copper features includes instructions to cathodically bias the first substrate to a first current comprising a pulsed current waveform and contact the first substrate with an electroplating solution.

* * * * *